United States Patent [19]
Ohta

[11] Patent Number: 5,917,767
[45] Date of Patent: Jun. 29, 1999

[54] SEMICONDUCTOR STORAGE DEVICE

[75] Inventor: Yoshiji Ohta, Kashiwara, Japan

[73] Assignee: Sharp Kabushiki Kaisha, Osaka, Japan

[21] Appl. No.: 08/993,797

[22] Filed: Dec. 18, 1997

[30] Foreign Application Priority Data

Dec. 25, 1996 [JP] Japan .................................. 8-345517
Mar. 21, 1997 [JP] Japan .................................. 9-067829

[51] Int. Cl.$^6$ .................................................. G11C 7/00
[52] U.S. Cl. ..................................... 365/203; 365/189.11
[58] Field of Search ............................... 365/203, 189.11

[56] References Cited

U.S. PATENT DOCUMENTS 5,623,446   4/1997   Hisada et al. ..................... 365/189.11
5,703,814  12/1997   Nishimura et al. ................ 365/189.11

OTHER PUBLICATIONS

"A High–speed Read Operation for Flash Memory Using Bit–line Clamped Sensing Scheme," by Y. Jyouno, T. Kawahara, S. Saeki, M. Miyamoto and K. Kimura, Conference of the Insitute of Electronics, Information and Communication Engineers, 1996.

Jyouno et al., "Study of flash memory high speed read operation using a bit line clamp method" *Conference of the Institute of Electronics, Information and Communication Engineers* (1996) 1 page total (English translation enclosed herewith, 4 pages total).

*Primary Examiner*—David Nelms
*Assistant Examiner*—M. Tran
*Attorney, Agent, or Firm*—Morrison & Foerster, LLP

[57] ABSTRACT

There is provided a semiconductor storage device which impairs neither sensing sensitivity nor sensing speed even when a number of memory cells are connected to an extension bit line. A boosting circuit boosts a voltage at an input node by a sensing sensitivity ΔV by a boost signal from a selecting circuit, thereby providing a potential difference ΔV between a voltage at the input node connected to a selected memory cell of a memory cell array and a voltage at an input node on a reference side. A sense amplifier amplifies the potential difference ΔV between the input node and the input node up to a voltage. Thus, a sufficient sensing sensitivity can be obtained without reducing a pre-charge voltage at the input node to a reference voltage. Therefore, a sufficient sensing sensitivity and a rapidly sensing speed can be secured even with a great bit line resistance existence due to the connection of a number of memory cells to the extension bit line.

8 Claims, 22 Drawing Sheets

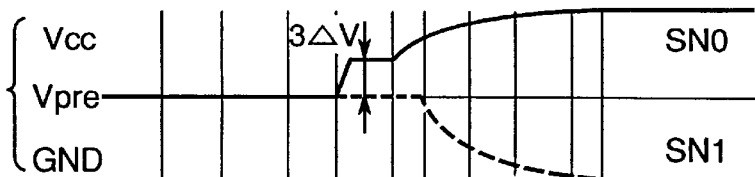

*Fig.11A* Voltages at Input Nodes SN0 and SN1 Information "00"

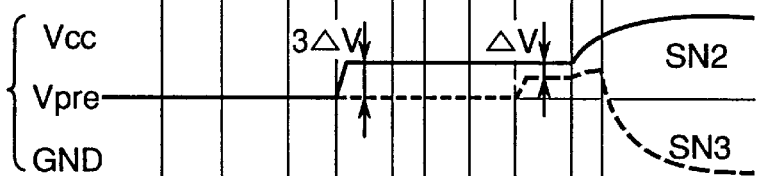

*Fig.11B* Voltages at Input Nodes SN2 and SN3 Information "00"

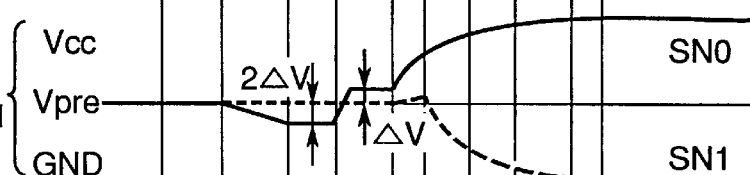

*Fig.11C* Voltages at Input Nodes SN0 and SN1 Information "01"

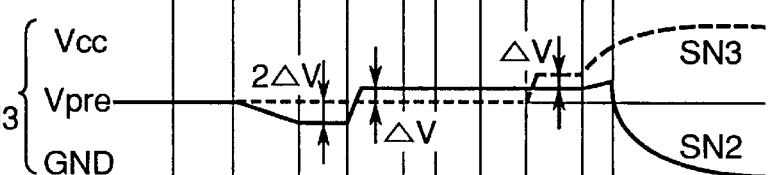

*Fig.11D* Voltages at Input Nodes SN2 and SN3 Information "01"

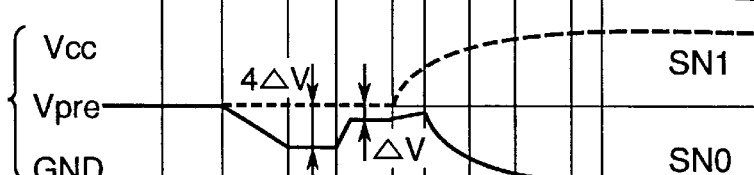

*Fig.11E* Voltages at Input Nodes SN0 and SN1 Information "10"

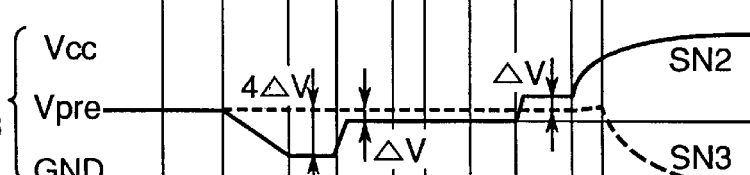

*Fig.11F* Voltages at Input Nodes SN2 and SN3 Information "10"

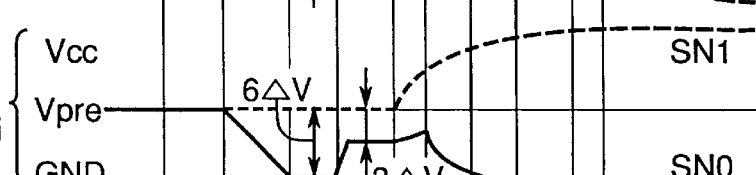

*Fig.11G* Voltages at Input Nodes SN0 and SN1 Information "11"

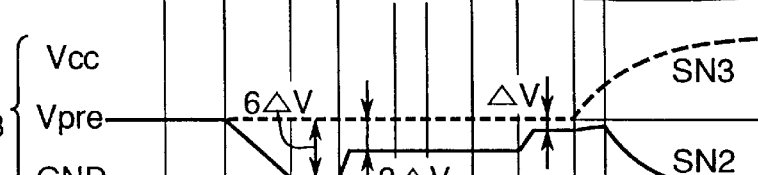

*Fig.11H* Voltages at Input Nodes SN2 and SN3 Information "11"

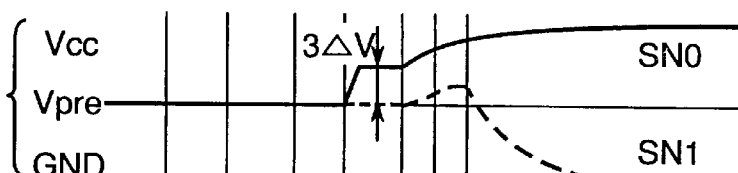

*Fig.15A*
Voltages at Input Nodes SN0 and SN1
Information "00"

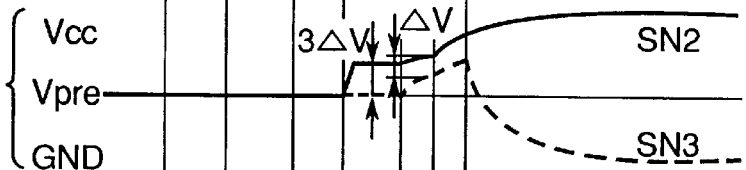

*Fig.15B*
Voltages at Input Nodes SN2 and SN3
Information "00"

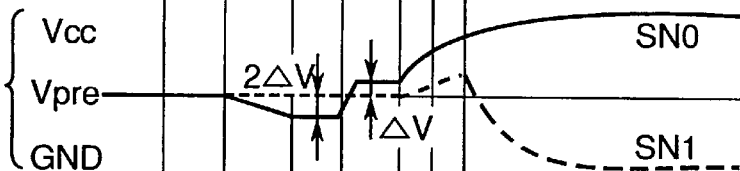

*Fig.15C*
Voltages at Input Nodes SN0 and SN1
Information "01"

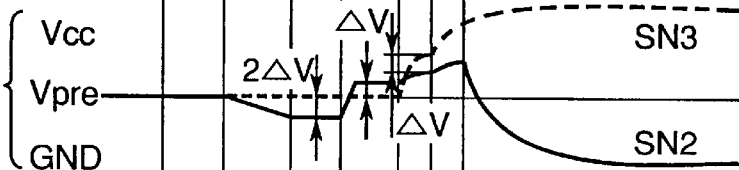

*Fig.15D*
Voltages at Input Nodes SN2 and SN3
Information "01"

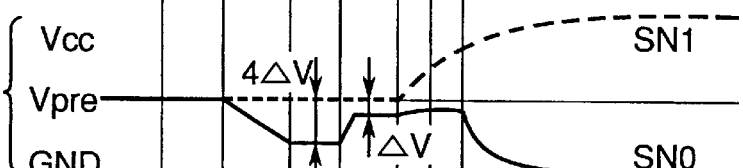

*Fig.15E*
Voltages at Input Nodes SN0 and SN1
Information "10"

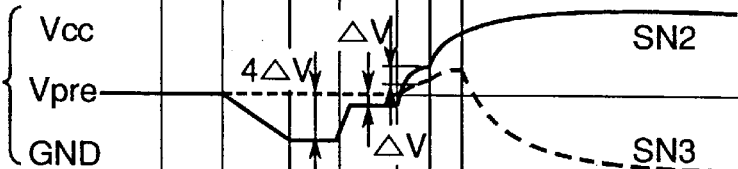

*Fig.15F*
Voltages at Input Nodes SN2 and SN3
Information "10"

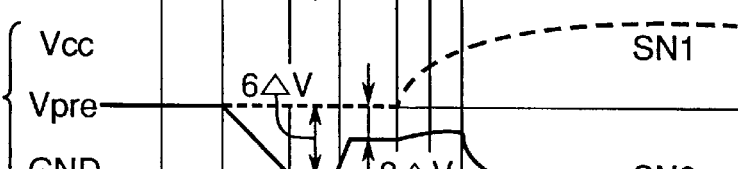

*Fig.15G*
Voltages at Input Nodes SN0 and SN1
Information "11"

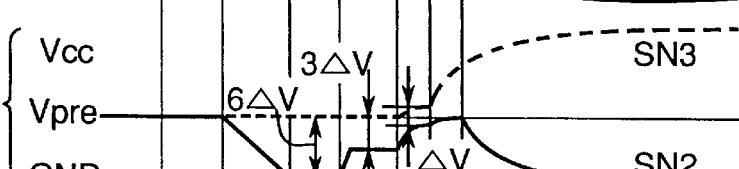

*Fig.15H*
Voltages at Input Nodes SN2 and SN3
Information "11"

SEMICONDUCTOR STORAGE DEVICE

BACKGROUND OF THE INVENTION

The present invention relates to semiconductor storage devices, and in particular, to a semiconductor storage device having a nonvolatile memory.

In recent years, nonvolatile semiconductor storage devices have made remarkable progress, and their storage capacities are rapidly increasing.

For the purpose of increasing the storage capacity through an identical manufacturing process, it is required to reduce the area per memory cell. Then, there is a device for reducing the number of contacts of bit lines with metal wiring lines by connecting a number of (e.g., 64) memory cells to a series of extension bit lines.

On the other hand, as a method for discriminating between "0" and "1" of information retained in the memory cells by detecting the level of the threshold voltage of each transistor constituting the memory cell, a current sensing method and a voltage sensing method exist.

According to the current sensing method, when selecting a memory cell, the current sensing is effected by deciding whether or not a current flows through the transistor constituting the selected memory cell. According to the voltage sensing method, a bit line is pre-charged, and after a memory cell connected to this bit line is selected, the voltage sensing is effected after waiting a sufficient time for the reduction of the voltage at the bit line to a reference voltage of a sense amplifier or a lower voltage.

The above voltage sensing method will be described below with reference to FIGS. 19 and 20.

Referring to FIG. 19, in a reading stage, firstly the level of a pre-charge signal φpre supplied to the gate electrodes of transistors 1 and 2 and the level of a cutoff signal φcut supplied to the gate electrodes of transistors 3 and 4 are set to Vcc. Then, the transistors 1, 2, 3 and 4 are turned on, so that input nodes 8 and 9 of inverters 6 and 7 constituting a sense amplifier 5 are charged with a pre-charge voltage Vpre via data lines 11 and 12 and the transistors 3 and 4.

Then, the pre-charge signal φpre is reduced to the GND level at a time point t0 (see FIG. 20) thereby turning off the transistors 1 and 2, and thereafter one memory cell is selected by a row decoder 14 and a column decoder 15 according to an address signal from an address bus 13 at a time point t1, so that the bit line and data line 11 corresponding to this selected memory cell are connected to each other. When a current flows through the above bit line via the selected memory cell, (i.e., when the retained information is "0"), the input node 8 and the data line 11 are discharged, so that their voltages are reduced from the pre-charge voltage Vpre.

Subsequently, a transistor 18 is turned on by setting the level of a reference signal φref supplied to the gate electrode of the transistor 18 to Vcc at a time point t2, thereby setting the voltages at the data line 12 and the input node 9 to a reference voltage Vref. When the electric potential at the input node 8 is reduced from the pre-charge voltage Vpre to a level that is lower than the reference voltage Vref by a sensing sensitivity (a voltage with which the sense amplifier 5 starts its sensing operation) ΔV or a lower level, a potential difference ΔV corresponding to the sensing sensitivity is generated between the input node 8 and the input node 9.

At the time point t3, the cutoff signal φcut supplied to the gate electrode of the transistor 3 is reduced to the GND level, thereby disconnecting the sense amplifier 5 from a memory cell array 10. Then, the level of a sense amplifier drive signal φse# is set to GND at a time point t4 thereby turning on a transistor 16, and the level of a sense amplifier drive signal φse is set to Vcc at a time point t5 thereby turning on a transistor 17, so that the sense amplifier 5 is driven to amplify the potential difference between the input nodes 8 and 9.

The thus amplified potential difference between the input nodes 8 and 9 is read from output terminals by turning on the transistors 19 and 20.

As a method for increasing the storage capacity by the same manufacturing process as the prior art, there is a method for increasing the number of bits of information which can be stored in one memory cell (providing so-called the multi-valued construction). In a flash memory or the like, the multi-valued construction is provided by controlling the threshold voltage of each transistor constituting the memory cell. In such a case, a sensing operation is required to be executed two or more times for the purpose of reading the information retained in the memory cell.

The read operation will be described below taking the case where four values (two bits in terms of information quantity) are stored into one memory cell as an example. FIG. 21 is a block diagram of the sense amplifier and its peripherals in the nonvolatile semiconductor storage device in which four values are stored into one memory cell. In this case, three types of reference voltages VrefH, VrefM and VrefL are used for executing the operation of sensing the four values.

First, for example, information stored in a memory cell CELL0 is sensed with the reference voltage VrefM by a first sense amplifier SA1. Subsequently, a voltage at an input node SN0 is supplied to the gate of a transistor Tr2 by a transistor Tr3 which is turned on and off upon the application of a sensing result transfer signal REFon thereto. Similarly, a voltage at an input node SN1 is supplied to the gate of a transistor Tr1 by a transistor Tr4 which is turned on and off upon the application of the sensing result transfer signal REFon thereto. Thus, the reference voltage of a second sense amplifier SA2 is set to either one of VrefH and VrefL according to the voltages at the input node SN0 and the input node SN1 (i.e., according to the sensing result of the first sense amplifier SA1).

In the case of the nonvolatile semiconductor storage device shown in FIG. 21, it is assumed that the information is "1" when a current flows through a bit line BL via the memory cell CELL0 and the information is "0" when no current flows, contrary to the case of the nonvolatile semiconductor storage device shown in FIG. 19.

The sensing operation of the nonvolatile semiconductor storage device shown in FIG. 21 will be described in concrete below.

FIG. 22 is a timing chart showing a sensing operation in the case where the information retained in the memory cell CELL0 is "00" or "01". Further, FIG. 23 is a timing chart showing a sensing operation in the case where the information retained in the memory cell CELL0 is "10" or "11".

Referring to FIG. 22, the information retained in the memory cell CELL0 is "00" or "01", and therefore, the input node SN0 is not discharged to a voltage below the reference voltage VrefM. Therefore, the voltage at the input node SN0 is increased to Vcc, while the voltage at the input node SN1 is reduced to GND. Therefore, when the sensing result transfer signal REFon becomes Vcc, the transistor Tr2 is turned on and the reference voltage of the second sense amplifier SA2 becomes VrefH which is higher by 2ΔV than VrefM. When the information retained in the memory cell CELL0 is "01", the discharge voltage at an input node SN2 becomes lower than the reference voltage VrefH, and therefore, the voltage at the input node SN2 is reduced to GND. In contrast to this, when the information is "00", the voltage at the input node SN2 is not discharged, and therefore, the reference voltage does not become lower than the reference voltage VrefH. Therefore, the voltage at the input node SN2 is increased to Vcc.

That is, according to the voltages at the input nodes SN0 and SN2, the information retained in the memory cell CELL0 is decided as follows:

input node SN0=Vcc, input node SN2=Vcc
→retained information="00"
input node SN0=Vcc, input node SN2=GND
→retained information="01"

On the other hand, in FIG. 23, the information retained in the memory cell CELL0 is "10" or "11", and therefore, the input node SN0 is discharged to a voltage which is not higher than the reference voltage VrefM. Therefore, the voltage at the input node SN0 is reduced to GND, while the voltage at the input node SN1 is increased to Vcc. Therefore, when the sensing result transfer signal REFon becomes Vcc, the transistor Tr1 is turned on and the reference voltage at the second sense amplifier SA2 becomes VrefL which is lower by $2\Delta V$ than VrefM. When the information retained in the memory cell CELL0 is "11", the discharge voltage at the input node SN2 becomes lower than the reference voltage VrefL, and therefore, the voltage at the input node SN2 is reduced to GND. In contrast to this, in the case where the information is "10", the discharge voltage at the input node SN2 does not become lower than the reference voltage VrefL. Therefore, the voltage at the input node SN2 is increased to Vcc.

Therefore, according to the voltages at the input nodes SN0 and SN2, the information retained in the memory cell CELL0 is decided as follows.

input node SN0=GND, input node SN2=Vcc
→retained information="10"
input node SN0=GND, input node SN2=GND
→retained information="11"

That is, in the nonvolatile semiconductor storage device having the above construction, it is required to execute the sensing operation ($\log_2 n$) times with (n−1) types of reference voltages for the purpose of reading the information of n values from the memory cells of the memory cell array.

However, the method for discriminating between "0" and "1" of the information retained in the memory cell of the nonvolatile semiconductor storage device shown in FIG. 19 has the following problems.

First, in the case of the current sensing method, diffused resistance (e.g., 10 k$\Omega$) of the bit line becomes substantially equal to the On-state resistance of the transistor constituting each memory cell, and this causes the problem that it is difficult to secure a sufficient current value (e.g., 100 $\mu$A) for executing the current sensing.

Furthermore, in the case of the voltage sensing method, the pre-charge voltage Vpre is set higher than the reference voltage Vref, and therefore, the voltage Vpre on the bit line is reduced to the reference voltage Vref of the sense amplifier 5 (at a time point tx) and further reduced to a level lower than the reference level Vref by not smaller than the sensing sensitivity $\Delta V$ when discharging the electric charges accumulated in the capacitance (e.g., 4 pF) of the bit line. It is required to wait a time (from time point t1 to time point t3) for this reduction of the voltage. This leads to the problem that too much time (e.g., 250 nsec) is required for the discharging.

In this case, the discharging time can be reduced if the pre-charge voltage Vpre is put closer to the reference voltage Vref. However, since a large fluctuation in voltage has been generated by the prior art voltage generating circuit, it is difficult to set the pre-charge voltage Vpre with an accuracy of about 0.1 V corresponding to the sensing sensitivity $\Delta V$. Therefore, it is impossible to put the pre-charge voltage Vpre closer to the reference voltage Vref with a difference of the sensing sensitivity $\Delta V$ provided, and therefore, this measure scarcely contributes to the reduction of the discharging time.

Furthermore, for the purpose of reading the multi-valued information retained in the memory cells of the nonvolatile semiconductor storage device shown in FIG. 21, it is required to execute the sensing operation many times with various kinds of reference voltages provided as stated above. Therefore, when reading the multi-valued information retained in the memory cells of the prior art nonvolatile semiconductor storage device, there is the problem of an increase in number of circuits by the reference voltage generating circuits.

Furthermore, as shown in FIGS. 22 and 23, there is required a time of 20 nsec for a decision time of t4 to t5 for deciding which one of the reference voltages VrefL and VrefH is to be selected, and a time of 10 nsec is required for a time of t5 to t6 for the stabilization of the selected reference voltage. Therefore, a time of 55 nsec is required for a time of t2 to t7 from the disconnection of the input nodes SN0 and SN2 from the bit line BL0 to the completion of the sensing operation of the second sense amplifier SA2, and this causes the problem of a delay in the access time.

SUMMARY OF THE INVENTION

The object of the present invention is therefore to provide a semiconductor storage device which impairs neither the sensing sensitivity nor the sensing speed even when a number of nonvolatile memory cells are connected to the extension bit line as well as a semiconductor storage device in which the increase in number of circuits and the increase in access time due to a multi-valued construction are suppressed.

In order to achieve the aforementioned object, the present invention provides a semiconductor storage device comprising:

a memory cell array having a plurality of nonvolatile memory cells, bit lines and word lines;

a row decoding circuit which selects the word line of the memory cell array;

a column decoding circuit which selects the bit line of the memory cell array;

a data line connected to the bit line selected by the column decoding circuit;

a sense amplifier which has a first input terminal and a second input terminal connected to the data line and amplifies a voltage difference between the first input terminal and the second input terminal;

a pre-charging circuit which pre-charges the first and second input terminals with a specified voltage;

a switching circuit which effects connection and disconnection between the data line and the second input terminal; and a voltage setting circuit which boosts or deboosts the voltage at the second input terminal by a specified voltage, thereby setting a sensing level of the sense amplifier.

According to the above construction, firstly the second input terminal of the sense amplifier is connected to the data line by the switching circuit, and thereafter the first and second input terminals are pre-charged by the pre-charging circuit. Then, one nonvolatile memory cell is selected by the row decoding circuit and the column decoding circuit based on the address signal, and the data line is connected to the bit line connected to the selected nonvolatile memory cell. Then, the second input terminal is disconnected from the data line by the switching circuit after a lapse of a sufficient time necessary for the voltage at the second input terminal to reduce (or increase) by two times the boosted voltage (or deboosted voltage) of the voltage setting circuit via the selected nonvolatile memory cell, and then the voltage at the second input terminal is boosted (or deboosted) by the specified voltage by the voltage setting circuit. Consequently, when the voltage at the second input terminal is not reduced (or increased) via the selected nonvolatile memory cell, the voltage at the second input terminal is made higher (or lower) by the specified voltage than the pre-charge voltage. When the voltage at the second input terminal is reduced (or increased), the voltage at the second input terminal is made lower (or higher) by the specified voltage than the pre-charge voltage.

Thus, by setting the boosted voltage (or deboosted voltage) as a voltage corresponding to the sensing sensitivity, the voltage difference between the voltage at the second input terminal and the pre-charge voltage can be made to be about the sensing sensitivity no matter whether the information of the selected nonvolatile memory cell is "0" or "1". Therefore, the pre-charge voltage at the first input terminal can be directly used as a reference voltage for the sense amplifier. Thus, the information retained in the selected nonvolatile memory cell is decided in a short sensing time achieved by virtue of the needlessness of waiting the time necessary for the pre-charge level to reduce to the reference level.

In one embodiment, the pre-charging circuit pre-charges the first and second input terminals with an equal voltage.

According to the above construction, the potential difference between the voltage at the second input terminal and the pre-charge voltage is made identical whether the information of the selected nonvolatile memory cell is "0" or "1", allowing the information of the selected nonvolatile memory cell to be surely decided.

An embodiment further comprises a memory cell array having a plurality of nonvolatile memory cells, bit lines and word lines;

- a row decoding circuit which selects the word line of the memory cell array;
- a column decoding circuit which selects the bit line of the memory cell array;
- a data line connected to the first input terminal of the sense amplifier and the bit line selected by the column decoding circuit;
- a switching circuit which effects connection and disconnection between the first input terminal of the sense amplifier and the data line of the first input terminal side;
- a voltage setting circuit which boosts or deboosts the voltage at the first input terminal by the specified voltage, thereby setting the sensing level of the sense amplifier; and
- a selecting circuit which selectively operates either one of the voltage setting circuit for boosting or deboosting the voltage at the first input terminal and the voltage setting circuit for boosting or deboosting the voltage at the second input terminal.

According to the above construction, when either one of the memory cell arrays is selected according to the address signal, the voltage at the input terminal connected to the data line corresponding to the bit line of the unselected memory cell array is kept at the pre-charge voltage.

Thus, by selectively operating the voltage setting circuit on the second input terminal side by the selecting circuit with the input terminal kept at the pre-charge voltage regarded as the first input terminal at the time point and with the input terminal connected to the data line corresponding to the bit line of the selected memory cell array regarded as the second input terminal, the information retained in the selected nonvolatile memory cell out of the pair of memory cell arrays can be decided in a short sensing time.

An embodiment further comprises a switching circuit which disconnects the bit line of an unselected memory cell array from the data line in the reading stage.

According to the above construction, the bit line of the unselected memory cell array is not connected to the data line in the reading stage. Thus, any external disturbance and interference from the unselected memory cell array on the data line side can be completely prevented.

In one embodiment, the selecting circuit selectively operates the voltage setting circuit for boosting or deboosting the input terminal connected to the data line connected to the bit line of the selected memory cell array based on an inputted address signal.

According to the above construction, the voltage setting circuit for boosting (or deboosting) the input terminal on the data line side corresponding to the bit line of the selected memory cell array is appropriately selected by the selecting circuit based on the address signal.

The present invention further provides a semiconductor storage device comprising:

- a memory cell array having a plurality of nonvolatile memory cells, bit lines and word lines;
- a row decoding circuit which selects the word line of the memory cell array;
- a column decoding circuit which selects the bit line of the memory cell array;
- at least two first and second sense amplifiers which have a first input terminal and a second input terminal connected to the bit line and amplify a voltage difference between the first input terminal and the second input terminal;
- a switching circuit which effects connection and disconnection between the bit line selected by the column decoding circuit and the second input terminals of the first and second sense amplifiers;
- a pre-charging circuit which pre-charges the first and second input terminals of the first and second sense amplifiers with a specified voltage;
- a first voltage setting circuit which boosts or deboosts the voltages at the second input terminals of the first and second sense amplifiers by a specified voltage, thereby setting the voltage at the second input terminals;
- a second voltage setting circuit which boosts or deboosts the voltage at the first input terminal of the second sense amplifier by a specified voltage, thereby setting a sensing level of the second sense amplifier;
- a third voltage setting circuit which boosts or deboosts the voltage at the second input terminal of the second sense amplifier by a specified voltage, thereby setting the sensing level of the second sense amplifier; and
- a selecting circuit which selectively operates either one of the second voltage setting circuit and the third voltage setting circuit based on the voltages at the first input terminal and the second input terminal of the first sense amplifier.

According to the above construction, firstly the second input terminals of the first and second sense amplifiers are connected to the bit line by the switching circuit, and thereafter the first and second input terminals of the first and second sense amplifiers are pre-charged by the pre-charging circuit. Then, the nonvolatile memory cell connected to the above bit line is selected by the row decoding circuit and the column decoding circuit based on the address signal. Then, the second input terminals of the first and second sense amplifiers are disconnected from the bit line by the switching circuit after a lapse of a sufficient time necessary for the voltages at the second input terminals of the first and second sense amplifiers to reduce (or increase) by two times the boosted voltage (or deboosted voltage) of the first voltage setting circuit via the selected nonvolatile memory cell, and then the voltages at the second input terminals of the first and second sense amplifiers are boosted (or deboosted) by the specified voltage by the first voltage setting circuit. Consequently, the relation in magnitude between the voltages at the first and second input terminals of the first and second sense amplifiers is set according to the value of the high-order bit of the multi-valued information which has at least two bits and is retained in the selected nonvolatile memory cell.

Therefore, by selectively operating either one of the second voltage setting circuit and the third voltage setting circuit by the selecting circuit based on the amplified voltages at the first input terminal and the second input terminal of the first sense amplifier, the relation in magnitude between the voltages at the first and second input terminals of the second sense amplifier is set according to the value of the bit next to the high-order bit of the multi-valued information retained in the selected nonvolatile memory cell.

Thus, the value of the high-order bit of the multi-valued information retained in the selected nonvolatile memory cell is discriminated based on the voltages at the first and second input terminals of the first sense amplifier. Further, the value of the bit next to the high-order bit is discriminated based on the voltages at the first and second input terminals of the second sense amplifier.

In the above case, the first and second sense amplifiers use the pre-charge voltage or its boosted (or deboosted) voltage as a reference voltage. Therefore, without using any reference voltage generating circuit for generating a plurality of reference voltages, the multi-valued information retained in the selected nonvolatile memory cell is decided.

In one embodiment, the selecting circuit operates the third voltage setting circuit when the voltage at the first input terminal of the first sense amplifier is higher than the voltage at the second input terminal and operates the second voltage setting circuit when the voltage at the second input terminal is higher than the voltage at the first input terminal.

According to the above construction, the relation in magnitude between the first and second input terminals of the second sense amplifier is optimally set based on the relation in magnitude between the voltages at the first and second input terminals of the first sense amplifier.

The present invention further provides a semiconductor storage device comprising:

a memory cell array having a plurality of nonvolatile memory cells, bit lines and word lines;

a row decoding circuit which selects the word line of the memory cell array;

a column decoding circuit which selects the bit line of the memory cell array;

at least two first and second sense amplifiers which have a first input terminal and a second input terminal connected to the bit line and amplify a voltage difference between the first input terminal and the second input terminal;

a switching circuit which effects connection and disconnection between the bit line selected by the column decoding circuit and the second input terminals of the first and second sense amplifiers;

a pre-charging circuit which pre-charges the first and second input terminals of the first and second sense amplifiers with a specified voltage;

a voltage setting circuit which boosts or deboosts the voltages at the second input terminals of the first and second sense amplifiers by a specified voltage, thereby setting the voltage at the second input terminal;

a first capacitive element provided across the first input terminal of the first sense amplifier and the second input terminal of the second sense amplifier; and a second capacitive element provided across the second input terminal of the first sense amplifier and the first input terminal of the second sense amplifier.

According to the above construction, firstly the second input terminals of the first and second sense amplifiers are connected to the bit line by the switching circuit, and thereafter the first and second input terminals of the first and second sense amplifiers are pre-charged by the pre-charging circuit. Then, the nonvolatile memory cell connected to the above bit line is selected by the row decoding circuit and the column decoding circuit based on the address signal. Then, the second input terminals of the first and second sense amplifiers are disconnected from the bit line by the switching circuit after a lapse of a sufficient time necessary for the voltages at the second input terminals of the first and second sense amplifiers to reduce (or increase) by two times the boosted voltage (or deboosted voltage) of the voltage setting circuit via the selected nonvolatile memory cell, and then the voltages at the second input terminals of the first and second sense amplifiers are boosted (or deboosted) by the specified voltage by the voltage setting circuit.

Consequently, when the voltage at the first input terminal of the first sense amplifier becomes higher than the voltage at the second input terminal, the second input terminal of the second sense amplifier is boosted (or deboosted) by the specified voltage by the first capacitive element. When the voltage at the second input terminal of the first sense amplifier becomes higher than the voltage at the first input terminal, the first input terminal of the second sense amplifier is boosted (or deboosted) by the specified voltage by the second capacitive element. Thus, the relation in magnitude between the voltages at the first and second input terminals of the first sense amplifier as well as the relation in magnitude between the voltages at the first and second input terminals of the second sense amplifier are set according to the values of the high-order bit and the next bit of the multi-valued information which has at least two bits and is retained in the selected nonvolatile memory cell.

Thus, the value of the high-order bit of the multi-valued information retained in the selected nonvolatile memory cell is discriminated based on the voltages at the first and second input terminals of the first sense amplifier. Further, the value of the bit next to the high-order bit is discriminated based on the voltages at the first and second input terminals of the second sense amplifier.

In the above case, the first and second sense amplifiers use the pre-charge voltage or its boosted (or deboosted) voltage as a reference voltage. Therefore, without using any reference voltage generating circuit for generating a plurality of reference voltages, the multi-valued information retained in the selected nonvolatile memory cell is decided.

Furthermore, the relation in magnitude between the voltages at the first and second input terminals of the second sense amplifier is set in a short time by the first and second capacitive elements based on the relation in magnitude between the voltages at the first and second input terminals of the first sense amplifier. Therefore, by executing one time the sensing operation by the first and second sense amplifiers, the multi-valued information retained in the selected nonvolatile memory cell is decided in a short access time.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 11A through 11H are charts showing voltage variations at input odes in an operation based on FIG. 10;

FIGS. 15A through 15H are charts showing voltage variations at input nodes in an operation based on FIG. 14;

DETAILED DESCRIPTION OF THE PREFERRED EMBODIMENTS

The present invention will be described in detail below based on the embodiments thereof with reference to the accompanying drawings.

First Embodiment

Figure 1:
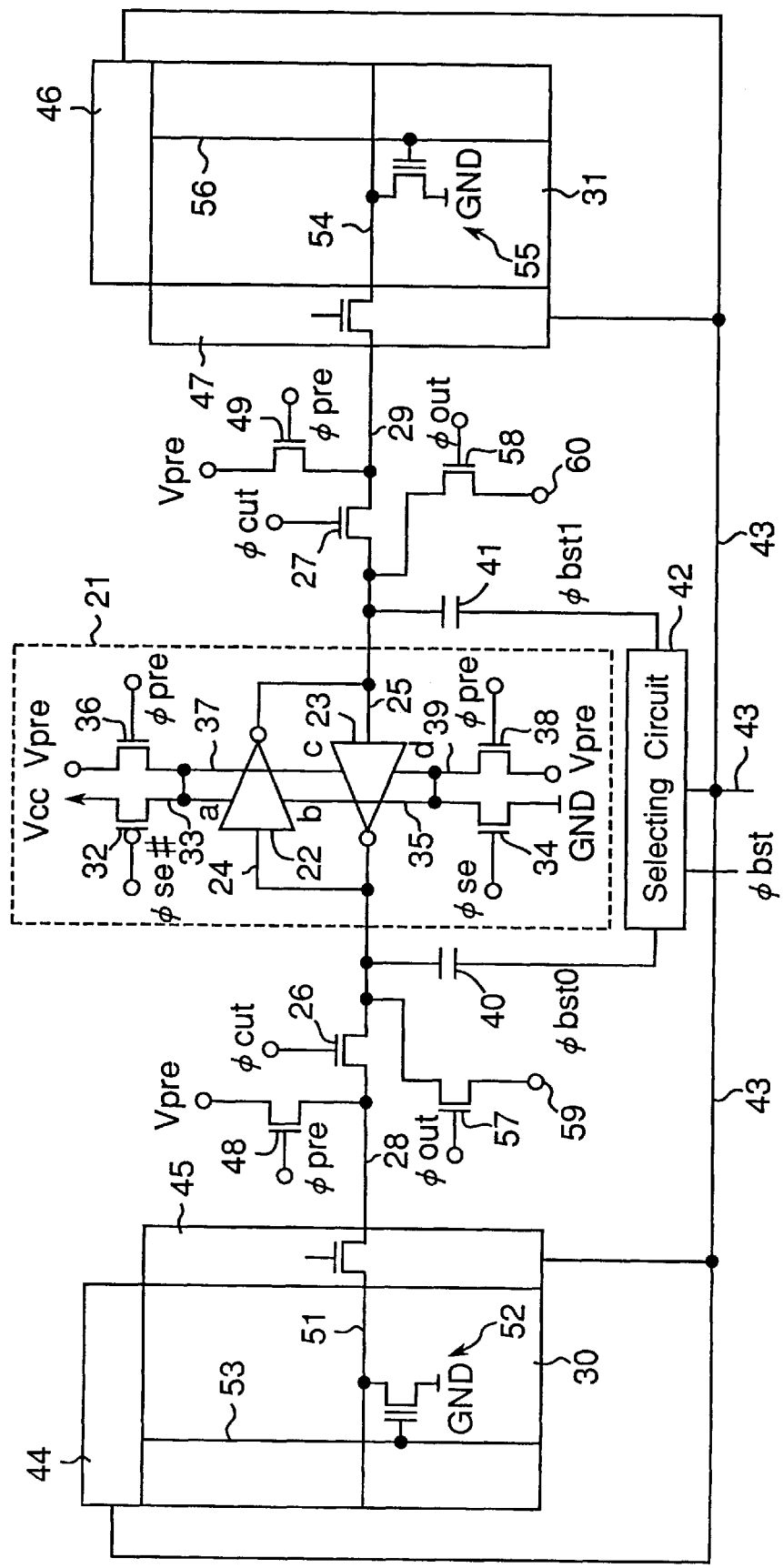
FIG. 1 is a block diagram showing an embodiment of a semiconductor storage device of the present invention.

FIG. 1 is a block diagram of a first embodiment of a semiconductor storage device of the present embodiment.

A sense amplifier 21 has two inverters 22 and 23 whose input terminals are connected to output terminals of the respective counterparts. Then, the inverter 22 has its input node 24 connected to a data line 28 via a transistor 26. Further, a bit line 51 of a memory cell array 30 can be connected to the data line 28 via a column decoder 45, and to this bit line 51 is connected a specified number (only one is shown in the figure for simplicity) of memory cells 52 constituting the memory cell array 30.

The inverter 23 of the sense amplifier 21 has its input node 25 connected to a data line 29 via a transistor 27. Then, a bit line 54 of a memory cell array 31 can be connected to the data line 29 via a column decoder 47, and to this bit line 54 is connected a specified number (only one is shown in the figure for simplicity) of memory cells 55 constituting the memory cell array 31.

It is herein assumed that the transistors constituting the memory cells 52 and 55 are n-channel transistors.

Further, in the above sense amplifier 21, the inverter 22 has its one power terminal "a" connected via a transistor 32 to an operating power source Vcc by a power source node 33 and also connected via a transistor 36 to a pre-charge voltage source Vpre by a power source node 37. The other power source terminal "b" is grounded via a transistor 34 by a power source node 35 and also connected via a transistor 38 to the pre-charge voltage source Vpre by a power source node 39. Similarly, one power source terminal "c" of the inverter 23 is connected via the transistor 36 to the pre-charge voltage source Vpre by the power source node 37 and also connected via the transistor 32 to the operating power source Vcc by the power source node 33. The other power source terminal "d" is connected via the transistor 38 to the pre-charge voltage source Vpre by the power source node 39 and also grounded via the transistor 34 by the power source node 35.

To the input node 24 of the inverter 22 is connected a boosting circuit 40 comprised of a capacitive element, and this boosting circuit 40 is connected to one output terminal of a selecting circuit 42. Similarly, to the input node 25 of the inverter 23 is connected a boosting circuit 41 comprised of a capacitive element, and this boosting circuit 41 is connected to the other output terminal of the selecting circuit 42. An address bus 43 is connected to one input terminal of the selecting circuit 42. In this case, the boosting circuits 40 and 41 constitute the aforementioned voltage setting circuit.

Further, the address bus 43 is connected to a row decoder 44 and the column decoder 45 of the memory cell array 30 and also connected to a row decoder 46 and the column decoder 47 of the memory cell array 31.

The data line 28 is connected to the pre-charge voltage source Vpre via a transistor 48, while the data line 29 is connected to the pre-charge voltage source Vpre via a transistor 49.

The above selecting circuit 42 varies the level of either one of the boost signal φbst0 for operating the rig boosting circuit 40 and a boost signal φbst1 for operating the boosting circuit 41 according to an address signal from the address bus 43 and the boost command signal φbst.

Figure 2:
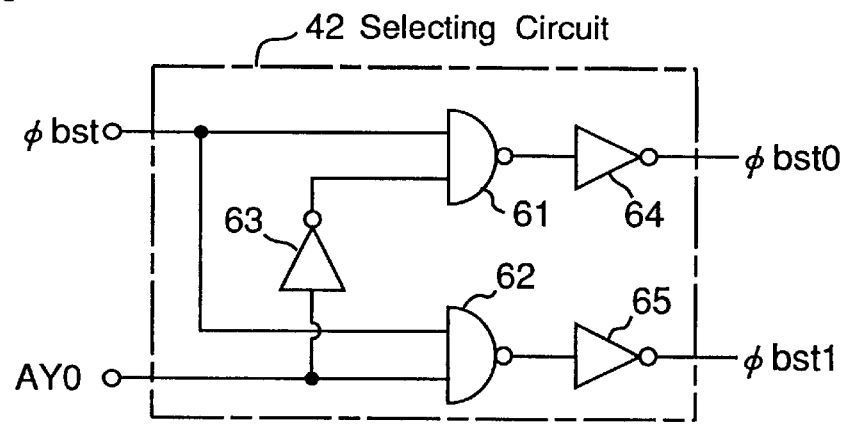
FIG. 2 is a diagram showing an example of a selecting circuit shown in FIG. 1.

FIG. 2 shows an example of the construction of the above selecting circuit 42, however, the present invention is not limited to this.

The selecting circuit 42 of the present embodiment is comprised of two NAND gates 61 and 62 and three inverters 63 through 65. The boost command signal φbst is inputted to the first input terminal of the NAND gate 61, and the most significant bit AY0 of the address signal (e.g., the row address signal) is inputted via the inverter 63 to the second input terminal of the NAND gate 61. On the other hand, the boost command signal φbst is inputted to the first input terminal of the NAND gate 62, and the most significant bit AY0 of the row address signal is inputted to the second input terminal of the NAND gate 62. Then, an output signal from the NAND gate 61 is outputted as the boost signal φbst0 via the inverter 64. On the other hand, an output signal from the NAND gate 62 is outputted as the boost signal φbst1 via the inverter 65.

Therefore, if the level of the boost command signal φbst becomes "H" (goes high) when the level of the most significant bit AY0 of the row address signal is "H", then the level of the boost signal φbst1 becomes "H" to operate the boosting circuit 41. In contrast to this, if the level of the boost command signal φbst becomes "H" when the level of the most significant bit AY0 is "L", then the level of the boost signal φbst0 becomes "H" to operate the boosting circuit 40.

As described above, generally in a nonvolatile memory, it is decided whether the information retained in a memory cell is "1" or "0" by detecting whether or not a current flows through an n-channel transistor (bit line) constituting the memory cell when the level of the voltage applied to the gate electrode of the transistor is set to "H" (when the memory cell is selected).

The operation in the reading stage of the semiconductor storage device having the above construction will be described in detail below.

Figure 4:
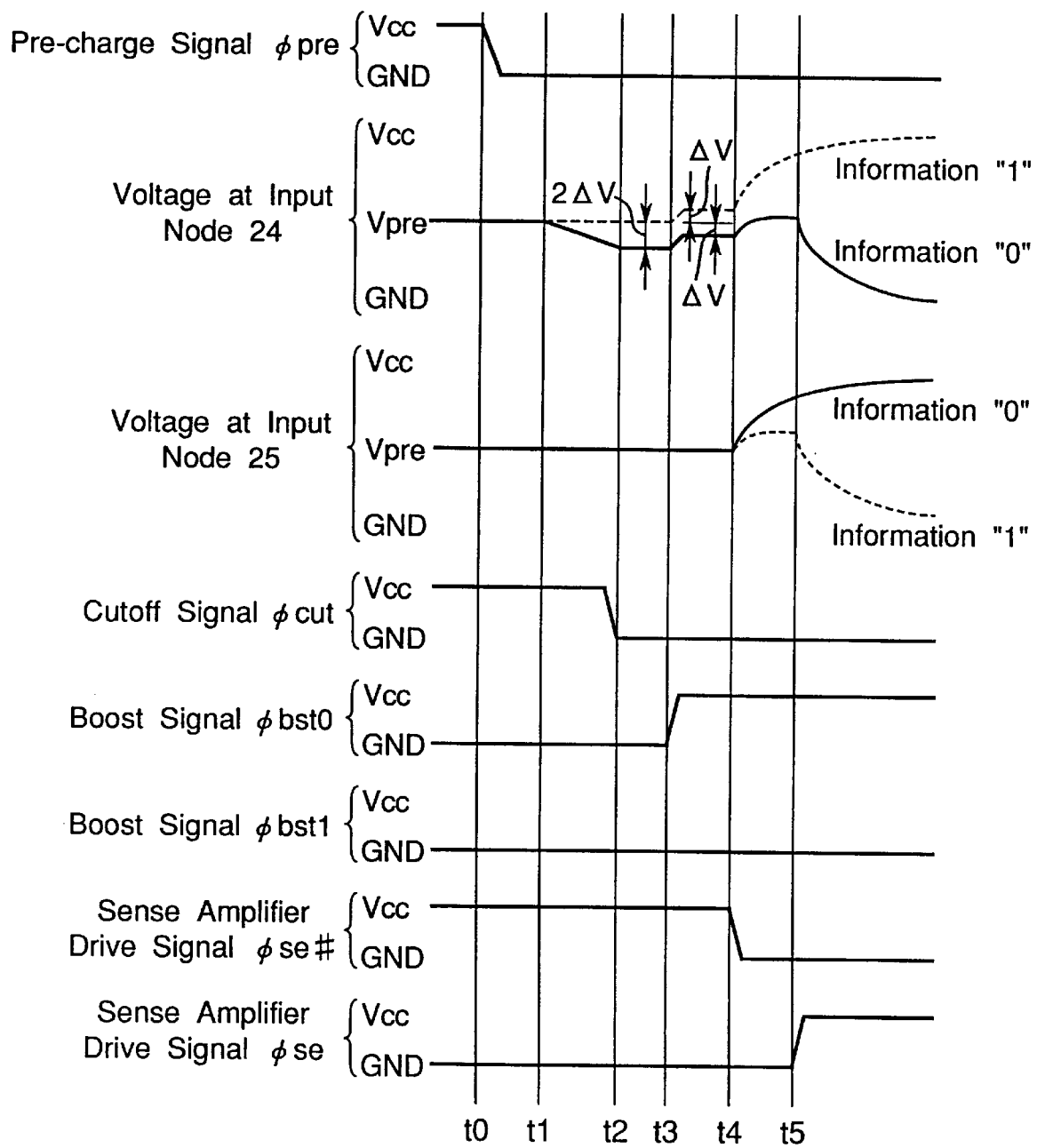
FIG. 4 is a timing chart of each portion of the semiconductor storage device shown in FIG. 1 in a voltage sensing stage.

It is to be noted that the reading in the present embodiment is executed by the voltage sensing method and its timing chart is shown in FIG. 4. Further, it is postulated for simplicity of explanation that the information is "0" when a current flows and the information is "1" when no current flows in the following description. Further, the following description is based on the assumption that the memory cell array 30 is selected and the memory cell array 31 is not selected.

In this case, as shown in FIG. 4, it is assumed that a pre-charge signal φpre and a cutoff signal φcut are made to have the operating power voltage Vcc so as to turn on the transistors 48, 49, 36, 38, 26 and 27, and the input nodes 24 and 25 of the inverters 22 and 23 and the power terminals "a" through "d" are charged with the pre-charge voltage Vpre.

First, at a time point t0 (see FIG. 4), the level of the pre-charge signal φpre is reduced to GND, thereby turning off the transistors 36, 38, 48 and 49.

Then, at a time point t1, one word line 53 of the memory cell array 30 is selected by the row decoder 44 according to the row address signal from the address bus 43, so that the memory cell 52 connected to the selected word line 53 is selected. Further, a bit line 51 of the memory cell array 30 is selected by the column decoder 45 according to the column address signal, so that the bit line 51 is connected to the data line 28. Similarly, the bit line 54 of the memory cell array 31 selected by the column decoder 47 is connected to the data line 29. When the information retained in the selected memory cell 52 is "1", the voltages at the data line 28 and the input node 24 which are charged with the pre-charge voltage Vpre are retained intact as indicated by a dashed line in FIG. 4. In contrast to this, when the information retained in the selected memory cell 52 is "0", the electric charges at the data line 28 and the input node 24 which are charged with the pre-charge voltage Vpre are discharged via the selected memory cell 52. Consequently, the voltages at the data line 28 and the input node 24 start to reduce as indicated by a solid line in FIG. 4.

On the other hand, the pre-charge voltage Vpre at the data line 29 connected to the bit line 54 of the nonselected memory cell array 31 and the input node 25 is retained intact.

Thus, at a time point t2 at which the voltage at the input node 24 reduces from the pre-charge voltage Vpre by about two times the sensitivity ΔV of the aforementioned sense amplifier since the information of the selected memory cell 52 of the selected memory cell array 30 is "0", the level of the cutoff signal φcut is reduced to GND, thereby turning off the transistors 26 and 27 and disconnecting the sense amplifier 21 from the data lines 28 and 29.

Subsequently, at a time point t3, the level of the boost command signal φbst supplied to the selecting circuit 42 is set to "H". Then, based on the most significant bit AY0 of the row address signal supplied when selecting the memory cell 52 of the memory cell array 30, the level of the boost signal φbst0 for operating the boosting circuit 40 on the selected memory cell array 30 side becomes "H" as stated above. Consequently, the voltage at the input node 24 is boosted by ΔV, and as indicated by the solid line in FIG. 4, the voltage at the input node 24 becomes lower by ΔV than the voltage Vpre at the input node 25 which serves as a reference level of the sense amplifier 21.

At a time point t4, the level of the sense amplifier drive signal φse# is set to GND for turning on the transistor 32, and thereafter the level of the sense amplifier drive signal φse is made to have the voltage Vcc of the operating power source at a time point t5 for turning on the transistor 34, thereby operating the sense amplifier 21. Then, as indicated by the solid line in FIG. 4, the potential difference ΔV between the input node 24 and the input node 25 is amplified to the voltage Vcc.

In contrast to this, when the voltage at the input node 24 is retaining the pre-charge voltage Vpre since the information of the selected memory cell 52 of the selected memory cell array 30 is "1", the level of the cutoff signal φcut is reduced to GND at the time point t2 for disconnecting the sense amplifier 21 from the data lines 28 and 29, and thereafter the boosting circuit 40 is operated at the time point t3 thereby boosting the voltage at the input node 24 by ΔV, when the voltage is made higher by ΔV than the voltage Vpre at the input node 25 which serves as the reference level of the sense amplifier 21 as indicated by the dashed line in FIG. 4.

Therefore, when the level of the sense amplifier drive signal φse# is set to GND at the time point t4 and the level of the sense amplifier drive signal φse is made to have the voltage Vcc at the time point t5 thereby operating the sense amplifier 21, the potential difference ΔV between the input node 24 and the input node 25 is amplified to the voltage Vcc as indicated by the dashed line in FIG. 4.

Figure 3:
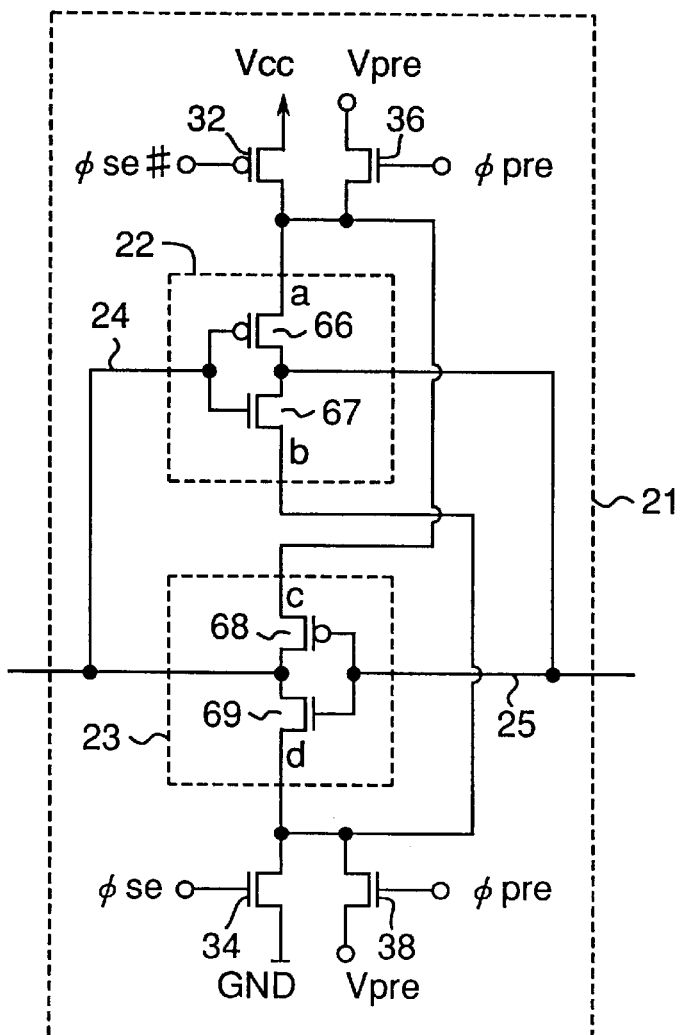
FIG. 3 is a diagram showing an example of a concrete circuit of sense amplifier shown in FIG. 1.

The amplifying operation of the sense amplifier 21 will be described in detail below. It is to be noted that the sense amplifier 21 of the present embodiment has a concrete circuit as shown in FIG. 3, however, the present invention is not limited to this. Furthermore, as stated above, the power terminals "a" through "d" of the inverters 22 and 23 have been charged with the pre-charge voltage Vpre by the time point t0.

It is now considered the case where the voltage at the input node 25 is the pre-charge voltage Vpre (reference level) and the voltage at the input node 24 is "Vpre−ΔV (when the retained information is "0")".

In this case, both the transistors 66 and 68 are turned on. However, a larger current flows through the transistor 66 since the gate voltage of the transistor 66 is lower, and consequently the voltage at the input node 25 reaches the voltage Vcc faster than the voltage at the input node 24. Consequently, the transistor 68 comes into its off-state faster than the transistor 66, and the voltage at the input node 24 does not reach Vcc.

When the transistor 34 is turned on at the time point t5, only the input node 24 is discharged, so that the potential difference between it and the input node 25 becomes the voltage Vcc.

Furthermore, in the case where the voltage at the input node 25 is the pre-charge voltage Vpre (reference level) and the voltage at the input node 24 is "Vpre+ΔV (when the retained information is "1")", the potential difference between the input node 24 and the input node 25 becomes the voltage Vcc in a similar manner.

Thus, the potential difference between the input node 24 and the input node 25 is amplified, and thereafter the level of a read signal φout is set to the voltage Vcc thereby turning on transistors 57 and 58. The electric potentials at the input nodes 24 and 25 having a potential difference of the voltage Vcc are detected from output terminals 59 and 60, and both the electric potentials are compared with each other. When electric potential at input node 24< electric potential at input node 25, meaning that a current has flowed through the bit line 51 via the selected memory cell 52, it is decided that the information retained in the selected memory cell 52 is "0". When electric potential at input node 24> electric potential at input node 25, meaning that no current has flowed through the bit line 51 via the selected memory cell 52, it is decided that the information retained in the selected memory cell is "1".

Thus, in the present embodiment, when the information retained in the memory cell 52 is "0", the input node 24 is discharged to have a voltage reduced by two times the sensing sensitivity ΔV from the pre-charge voltage Vpre, and thereafter the voltage at the input node 24 is boosted by ΔV by the operations of the selecting circuit 42 and the boosting circuit 40. When the retained information is "1", the pre-charge voltage Vpre at the input node 24 is directly boosted by ΔV by the operations of the selecting circuit 42 and the boosting circuit 40. Therefore, in either case, an electric potential of a sensing sensitivity ΔV can be provided between the voltage at the input node 24 and the voltage at the input node 25 on the reference side.

Figure 20:
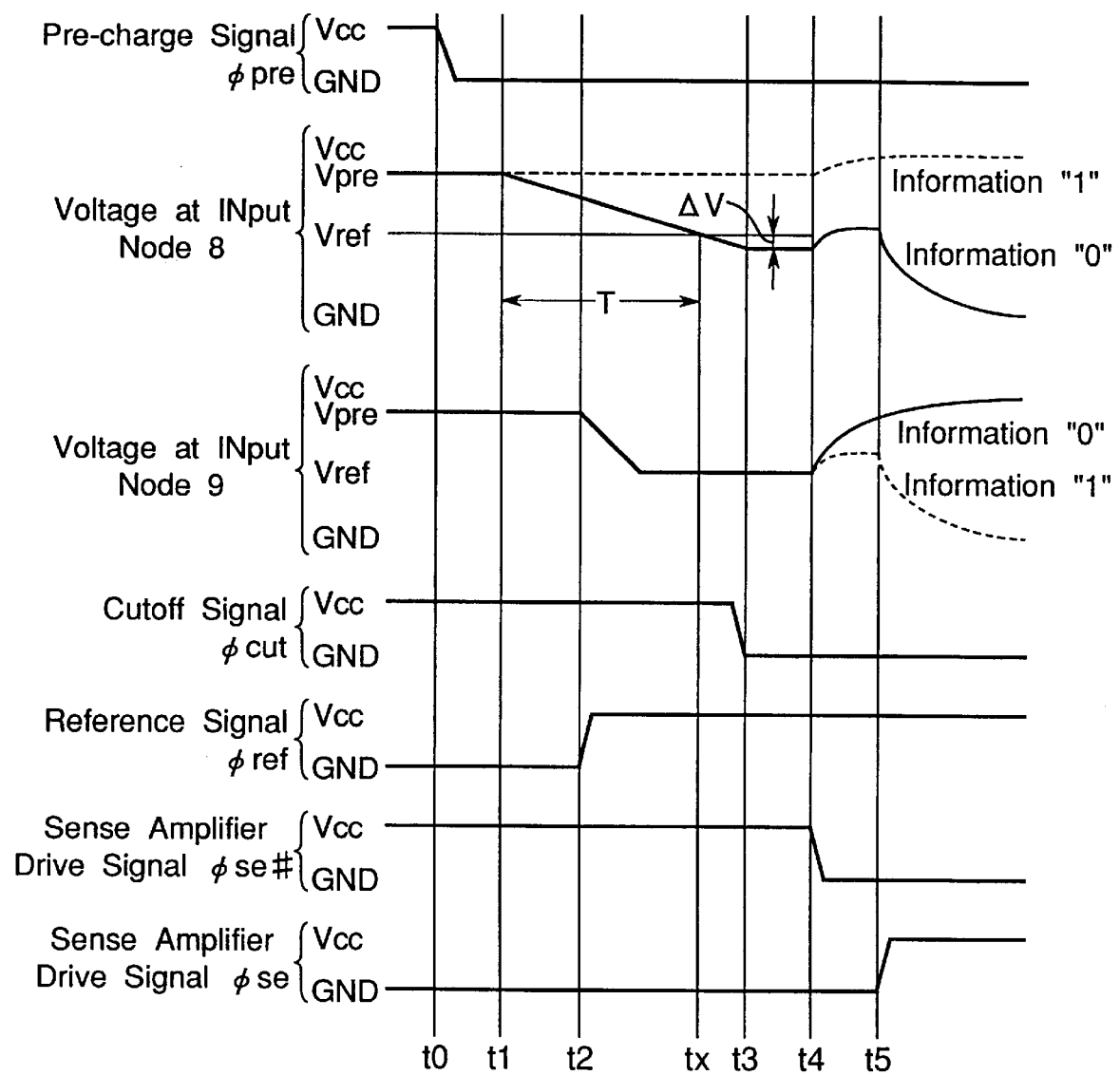
FIG. 20 is a timing chart of each portion of the semiconductor storage device shown in FIG. 19 in the voltage sensing stage.
Figure 21:
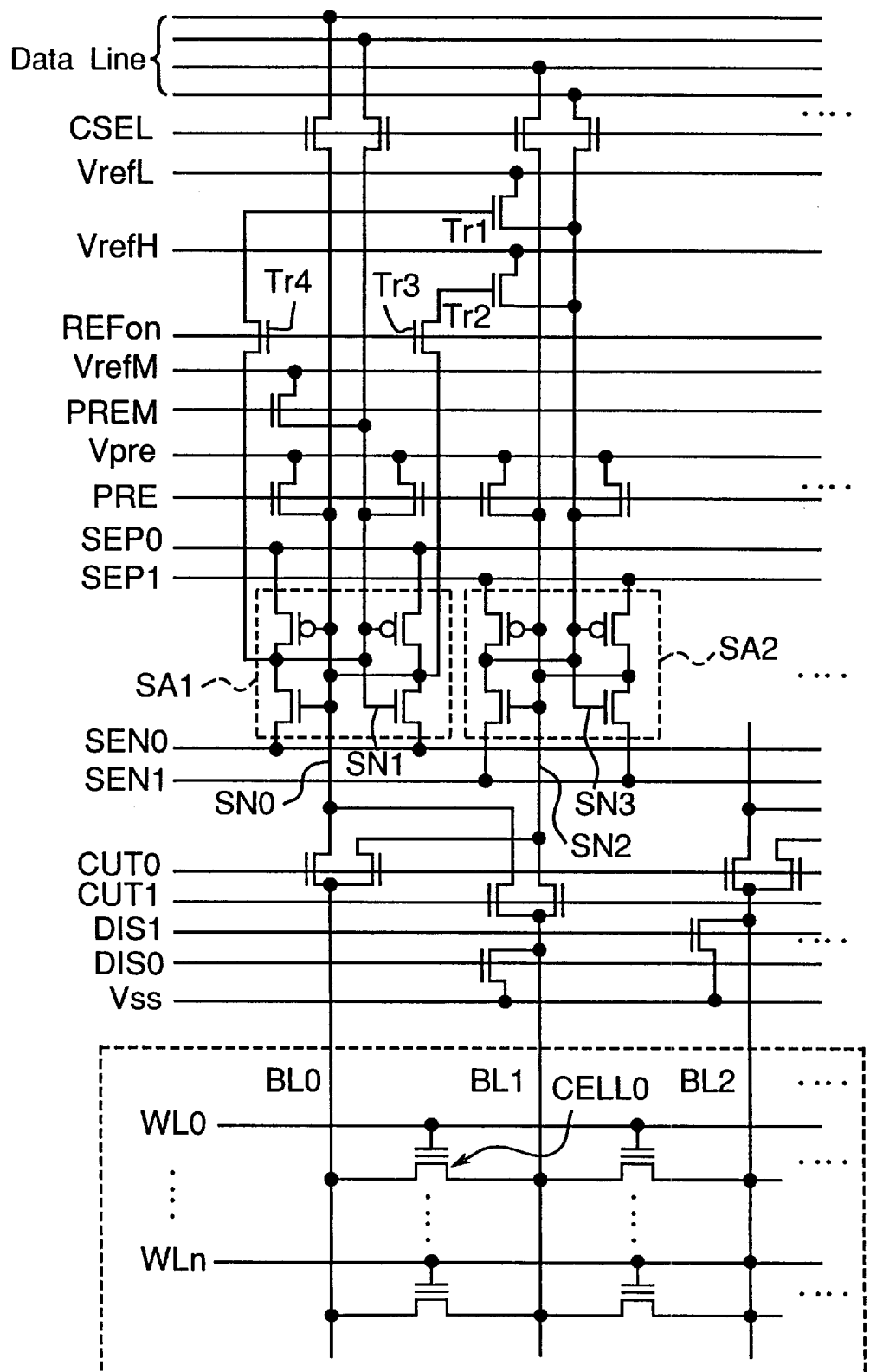
FIG. 21 is a circuit diagram of a sense amplifier and its peripheries according to an example of the prior art multiple value storing nonvolatile semiconductor storage device.

Therefore, the pre-charge level Vpre at the input node 25 can be directly used as the reference level of the sense amplifier 21, thereby obviating the need for waiting for the reduction of the pre-charge level Vpre at the input node 24 to the reference level (in this case, the discharge voltage is, for example, 1.5 V to 2.3 V) in the voltage sensing operation executed by the sense amplifier 21 in contrast to the prior art voltage sensing operation. By that much (by a time T (e.g., 220 nsec) in FIG. 20), the sensing time of the sense amplifier 21 can be reduced.

In the concrete, assuming that the sensing sensitivity ΔV of the sense amplifier 21 is 0.1 V and a bit line capacitance is 4 pF, the discharging time (from the time point t1 to the time point t2 in FIG. 4) is 50 nsec. This proves the fact that the discharging time is remarkably reduced (to about 1/5) from the prior art discharging time of 250 nsec.

That is, the total discharge voltage of 2ΔV of the present embodiment is about two times as great as the sensing sensitivity (e.g., 0.2 V). Therefore, the present semiconductor storage device can operate with a smaller current and the discharging time is reduced, so that the sensing speed becomes fast.

Furthermore, the boosted electric potential ΔV in boosting the voltages at the input nodes 24 and 25 can be easily set by varying the capacitance values of the capacitive elements constituting the boosting circuits 40 and 41 by changing the mask in forming a circuit, switching a switching circuit after the formation of the circuit or changing the voltages of "H" level of the boost signal φbst0 and the boost signal φbst1. In the above case, the capacitance value is, for example, 0.01 pF to 0.04 pF. The thus-set boosted electric potential ΔV has a higher accuracy than when a reference power source for generating a reference voltage lower by the sensing sensitivity ΔV than the pre-charge voltage Vpre is separately provided, and it depends less on the operating power voltage source Vcc.

It is to be noted that the aforementioned capacitive element may be fabricated with an oxide film interposed between two polysilicon layers or with a MOS (Metal-Oxide-Semiconductor) capacitor.

That is, according to the present embodiment, even though the bit line resistance is great due to the connection of a number of memory cells to the extension bit. line, a sufficient sensing sensitivity can be secured with a small current at high speed (e.g., within a time of 80 nsec from the time point t1 to the completion of the sensing).

The above description has been made on the assumption that the memory cell array 30 is selected. However, similarly to the above, when the memory cell array 31 is selected, it is proper to execute charging of the data lines 28 and 29 and the power terminals "a" through "d", selecting of the word line 56 of the memory cell array 31, connecting of the bit line 54 of the memory cell array 31 to the data line 29, connecting of the bit line 51 of the memory cell array 30 to the data line 28, disconnecting of the sense amplifier 21 from the data lines 28 and 29, boosting of the input node 25 and amplifying of the potential difference between the input node 24 and the input node 25 by the sense amplifier 21.

Furthermore, in the above embodiment, the bit line 54 of the memory cell array 31 on the unselected side is connected to the data line 29 by, for example, the column decoder 47 according to the column address signal, and an electrical balance between both sides of the sense amplifier 21 is achieved by taking the diffusion leak and the like of the bit lines 51 and 54 into consideration. In contrast to this, it is acceptable to prevent the possible occurrence of an external disturbance or interference from the memory cell array 31 on the unselected side on the data line 29 by preventing the bit line 54 on the unselected side from being connected to the data line 29 by functioning the column decoder 47 as a switching circuit. With this arrangement, the consumption power can be further reduced.

Figure 5:
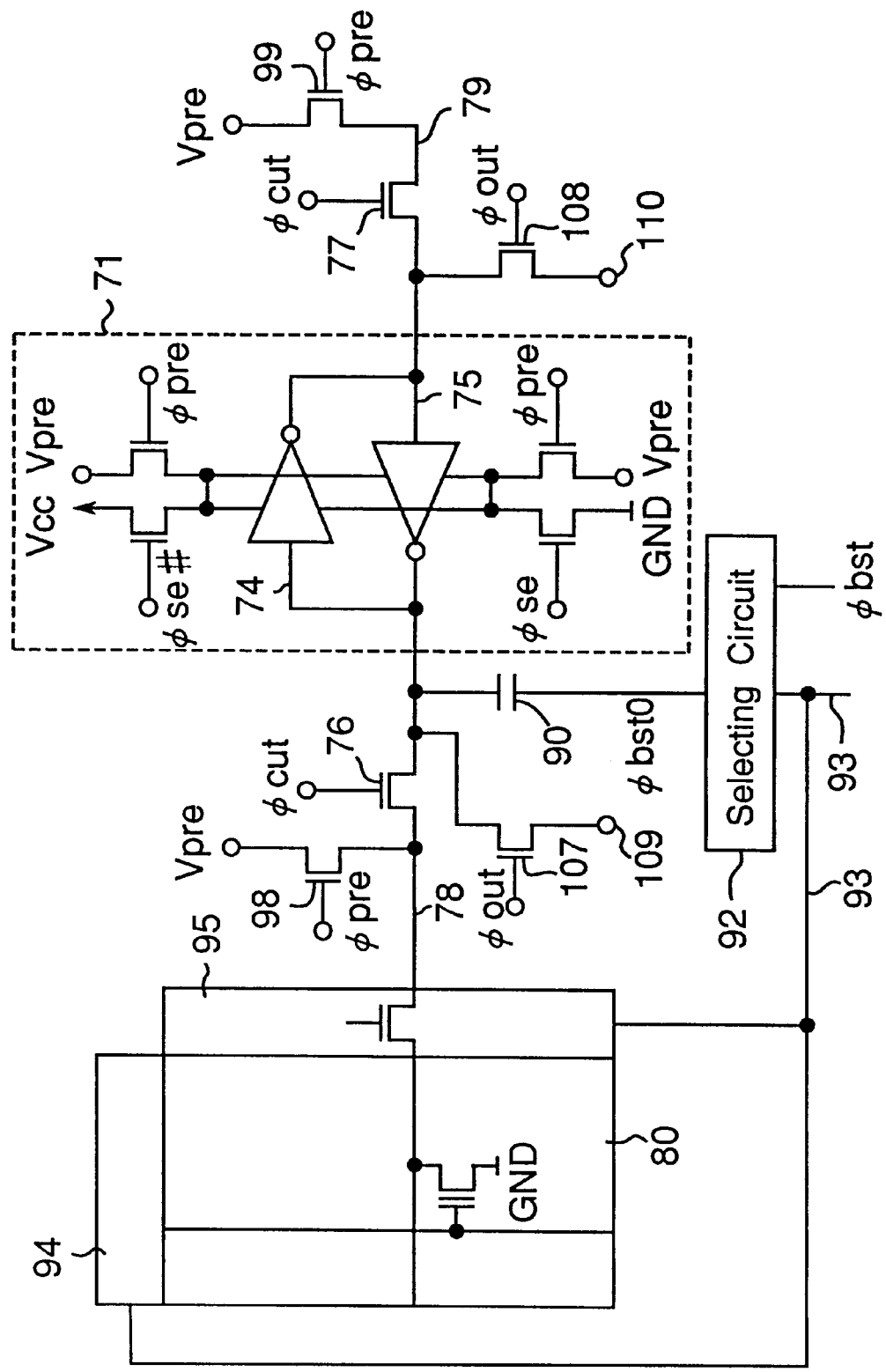
FIG. 5 is a block diagram showing an example different from that of FIG. 1 of the semiconductor storage device of the present invention.

Furthermore, the above has described the case where two memory cell arrays 30 and 31 are existing in the above embodiment, however, only one memory cell array may be provided as shown in FIG. 5.

It is to be noted that a sense amplifier 71, a transistor 76, a transistor 77, a data line 78, a data line 79, a memory cell array 80, a boosting circuit 90, a selecting circuit 92, an address bus 93, a row decoder 94, a column decoder 95, a transistor 98, a transistor 99, a transistor 107 and a transistor 108 in FIG. 5 have the same constructions and operations as those of the sense amplifier 21, transistor 26, transistor 27, data line 28, data line 29, memory cell array 30, boosting circuit 40, selecting circuit 42, address bus 43, row decoder 44, column decoder 45, transistor 48, transistor 49, transistor 57 and transistor 58 shown in FIG. 1. It is to be noted that the selecting circuit 92 selects only the boosting circuit 90.

Furthermore, the transistors of the memory cells 52, 55, . . . in each of the aforementioned embodiments are n-channel transistors. Therefore, when each of the memory cells 52, 55, . . . is selected, the data lines 28, 29 and 78 are discharged in the case where the information retained in each of the memory cells 52, 55, . . . is "0".

However, the present invention is not limited to this, and it can be applied to a memory cell array in which the memory cells are provided by p-channel transistors, and when a memory cell is selected and the information retained in the memory cell is "1", the corresponding data line is charged. It is to be noted that, in such a case, it is required to conversely deboost the voltage instead of boosting the voltage at the input node of the sense amplifier by the sensing sensitivity $\Delta V$.

Second Embodiment

Figure 6:
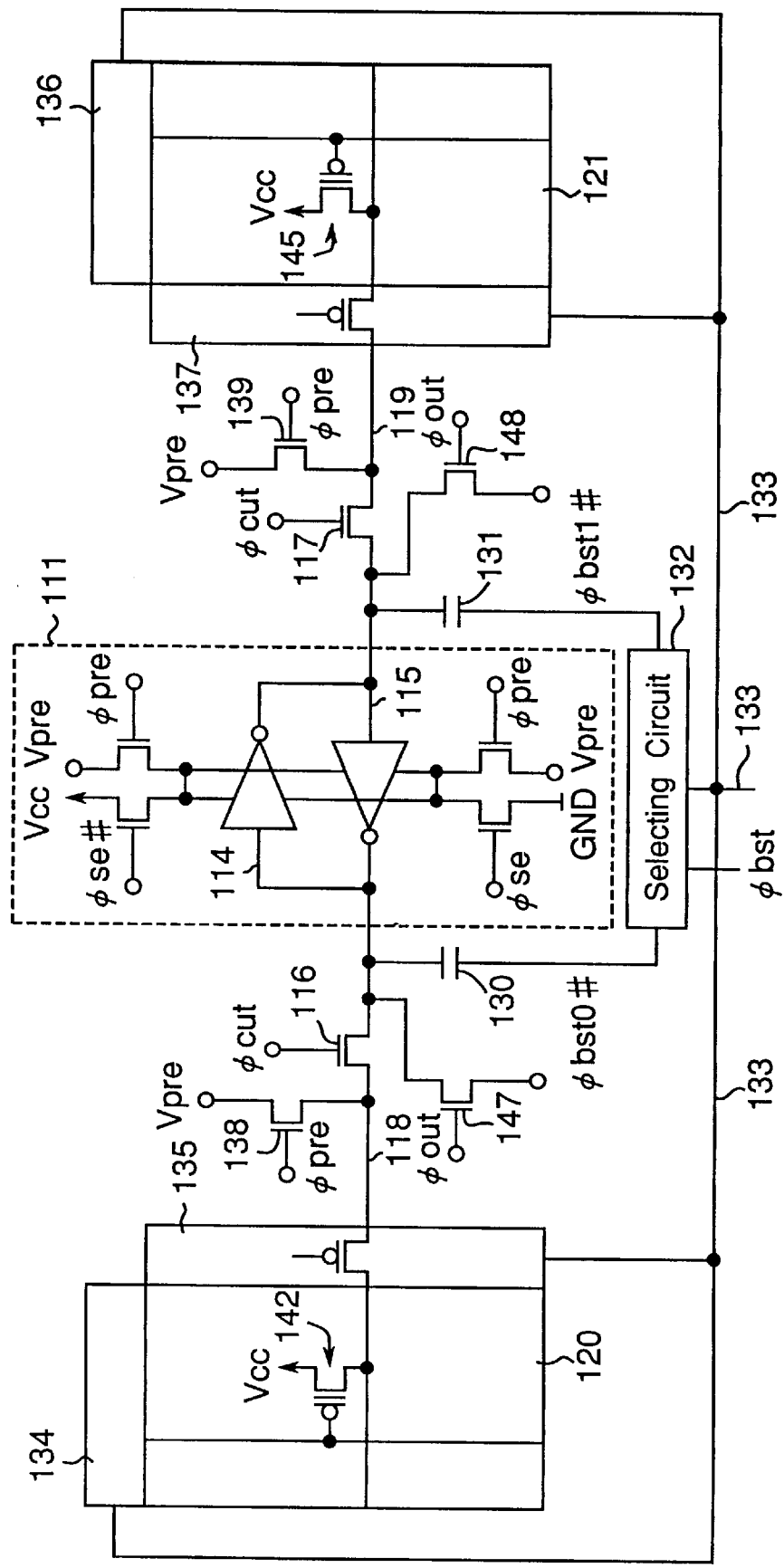
FIG. 6 is a block diagram showing an embodiment different from those of FIGS. 1 and 5 of the semiconductor storage device of the present invention.

FIG. 6 is a block diagram of a semiconductor storage device in the case where the transistors of its memory cells are provided by p-channel transistors.

A sense amplifier 111, a transistor 116, a transistor 117, a data line 118, a data line 119, an address bus 133, a row decoder 134, a column decoder 135, a row decoder 136, a column decoder 137, a transistor 138, a. transistor 139, a transistor 147 and a transistor 148 have the same constructions and operations as those of the sense amplifier 21, transistor 26, transistor 27, data line 28, data line 29, address bus 43, row decoder 44, column decoder 45, row decoder 46, column decoder 47, transistor 48, transistor 49, transistor 57 and transistor 58 shown in FIG. 1.

The transistors of the memory cells 142 and 145 constituting the memory cell arrays 120 and 121 in the present embodiment are p-channel transistors. The sense amplifier 111 has its input node 114 connected to a deboosting circuit 130 comprised of a capacitive element, and this deboosting circuit 130 is connected to one output terminal of the selecting circuit 132. Similarly, to the input node 115 is connected a deboosting circuit 131 comprised of a capacitive element, and this deboosting circuit 131 is connected to the other output terminal of the selecting circuit 132. The selecting circuit 132 varies the level of either one of a deboost signal φbst0# for operating the deboosting circuit 130 and a deboost signal φbst1# for operating the deboosting circuit 131 according to an address signal from the address bus 133 and a deboost command signal φbst.

That is, the deboosting circuits 130 and 131 constitute a voltage setting circuit.

Figure 7:
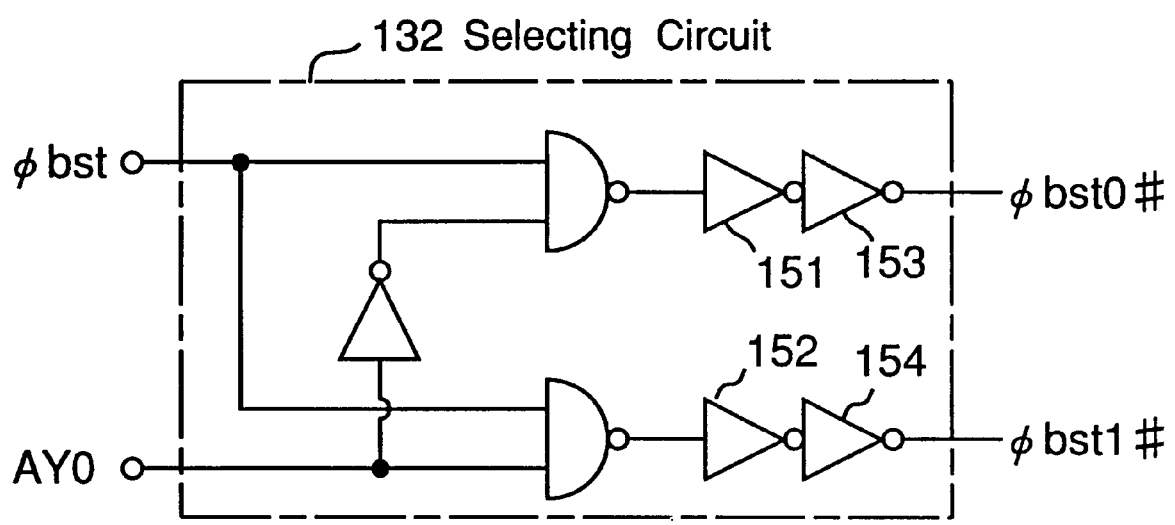
FIG. 7 is a diagram showing an example of the construction of a selecting circuit shown in FIG. 6.

As shown in FIG. 7, the selecting circuit 132 of the present embodiment has a construction in which inverters 153 and 154 are added to the construction shown in FIG. 2. The inverter 153 is connected to an inverter 151 corresponding to the inverter 64 shown in FIG. 2, while the inverter 154 is connected to an inverter 152 corresponding to the inverter 65 shown in FIG. 2. In regard to this selecting circuit 132, in the case where the level of the deboost command signal φbst becomes "H" when the level of the most significant bit AY0 of the row address signal is at "H", the level of the deboost signal (φbst1# becomes "L", so that the deboosting circuit 131 operates. In contrast to this, in the case where the level of the deboost command signal φbst becomes "H" when the level of the most significant bit AY0 of the row address signal is at "L", the level of the deboost signal φbst0# becomes "L", so that the deboosting circuit 130 operates.

Figure 8:
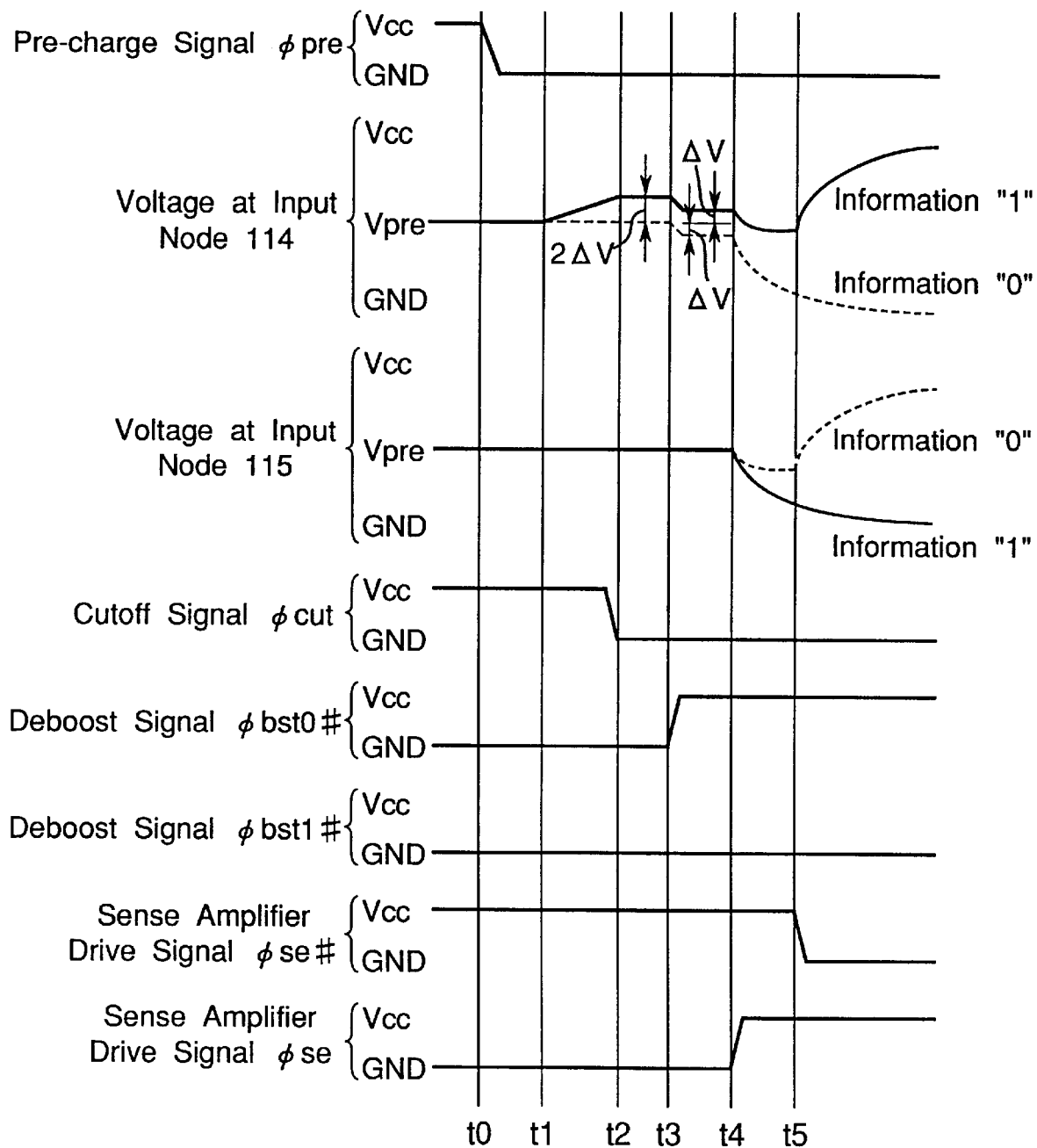
FIG. 8 is a timing chart of each portion of the semiconductor storage device shown in FIG. 6 in the voltage sensing stage.

The semiconductor storage device having the above construction operates in the reading stage according to the timing chart shown in FIG. 8. In this case, the information is "1" when a current flows and the information is "0" when no current flows.

When the information retained in the selected memory cell 142 is "1", the input node 114 is charged so that its voltage increases from the pre-charge voltage Vpre by two times the sensing sensitivity $\Delta V$ and thereafter the voltage at the input node 114 is deboosted by $\Delta V$ by the operations of the selecting circuit 132 and the deboosting circuit 130. When the retained information is "0", the pre-charge voltage Vpre at the input node 114 is directly deboosted by $\Delta V$ by the operations of the selecting circuit 132 and the deboosting circuit 130. Therefore, in either case, a potential difference of the sensing sensitivity $\Delta V$ is generated between the voltage at the input node 114 and the voltage at the input node 115 on the reference side.

The same operations as above are executed when the selected memory cell array is the memory cell array 121. Further, the same operations are executed in the case where only one memory cell array 120 is provided (corresponding to FIG. 5).

It is to be noted that the level of the sense amplifier drive signal φse is set to the voltage Vcc of the operating power source at the time point t4 in driving the sense amplifier 111 and thereafter the level of the sense amplifier drive signal φse# is set to GND at the time point t5 in the above embodiment, contrary to the case of the embodiment shown in FIG. 1. Which one of the sense amplifier drive signal φse# (signal for connecting to GND the power terminals "b" and "d" on the n-channel transistors 67 and 69 side constituting the sense amplifier 21 in FIG. 3) and the sense amplifier drive signal φse# (signal for connecting to the operating power voltage Vcc the power terminals "a" and "c" on the p-channel transistors 66 and 68 side constituting the sense amplifier 21 in FIG. 3) is firstly made to have an activated level depends on the electric potential of the pre-charge voltage Vpre. That is, by firstly making the sense amplifier drive signal φse have the activated level when the electric potential of the pre-charge voltage Vpre is closer to the operating power voltage Vcc and firstly making the sense amplifier drive signal φse# have the activated level when the electric potential is closer to GND, the sensitivity of the sense amplifier is improved and an improved operating margin is achieved.

The sense amplifiers 21, 71, 111 in the aforementioned embodiments are not limited to the constructions shown in FIGS. 1, 5 and 6. The essential factor is that the sense amplifiers are each required to be a differential amplifier which detects the potential difference between the input node 24, 74, 114 and the input node 25, 75, 115 and amplifies the same.

Third Embodiment

The present embodiment is related to a semiconductor storage device in which the increase in number of circuits due to a multi-valued construction is suppressed.

Figure 9:
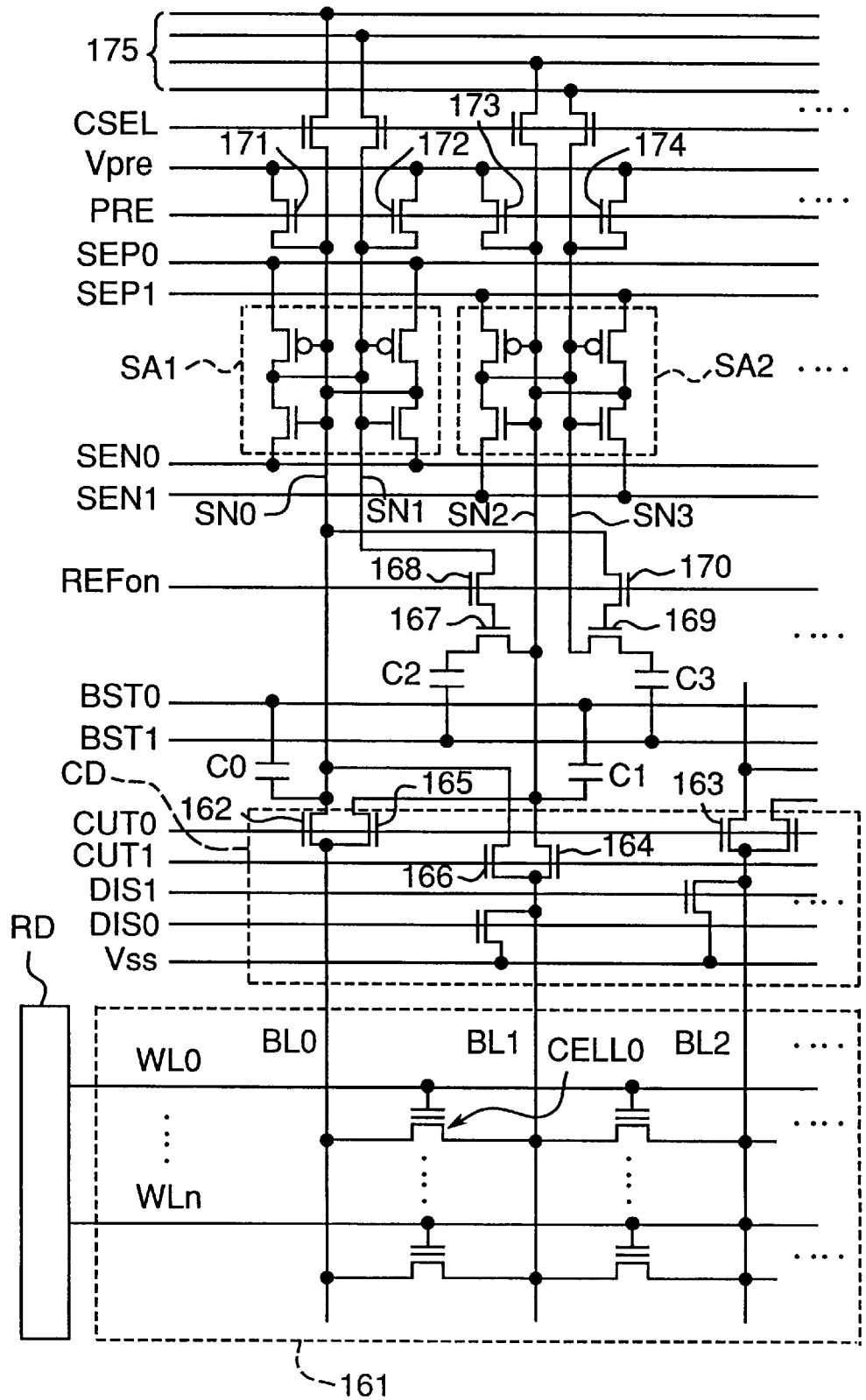
FIG. 9 is a circuit diagram of a sense amplifier and its peripheries according to an embodiment of a semiconductor storage device in which an increase in number of circuits due to a multi-valued construction is suppressed by the present invention.

FIG. 9 is a circuit diagram mainly showing the memory cell array and the sense amplifier of the semiconductor storage device of the present embodiment.

Bit lines BL0, BL2, . . . (referred to as an even-number bit line hereinafter) connected to the drains of transistors constituting the memory cells CELL of a memory cell array 161 are connected to respective input nodes SN0, . . . of the first sense amplifiers SA1, . . . via transistors 162, 163, . . . which are turned on and off by a bit line cutoff signal CUT0. Further, bit lines BL1, BL3, (referred to as an odd-number bit line hereinafter) connected to the sources of the above transistors are connected to respective input nodes SN2, . . . of the second sense amplifiers SA2, . . . via transistors 164, . . . which are turned on and off by a bit line cutoff signal CUT1.

Further, the even-number bit line BL0 and the input node SN2 are connected to each other via a transistor 165 which is turned on and off by the bit line cutoff signal CUT0. The input node SN0 and the odd-number bit line BL1 are connected to each other via a transistor 166 which is turned on and off by the bit line cutoff signal CUT1. The other even-number bit lines BL2, . . . and the odd-number bit lines BL3, . . . are similarly connected to the respective input nodes via respective transistors which are turned on and off by the bit line cutoff signals CUT0 and CUT1.

It is to be noted that a reference character RD denotes a row decoder, and a reference character CD denotes a column decoder.

The above input node SN2 is connected to an input line of a boost signal BST1 via a boosting circuit C2 comprised of a capacitive element and a transistor 167. Then, the gate of the transistor 167 is connected to the input node SN1 of the first sense amplifier SA1 via a transistor 168 which is turned on and off by the sensing result transfer signal REFon. The input node SN3 of the second sense amplifier SA2 is connected to the input line of the boost signal BST1 via a boosting circuit C3 comprised of a capacitive element and a transistor 169. The gate of the transistor 169 is connected to the input node SN0 via a transistor 170 which is turned on and off by the sensing result transfer signal REFon.

The input node SN0 is connected to the input line of a boost signal BST0 via a boosting circuit C0 comprised of a capacitive element. The input node SN2 is connected to the input line of the boost signal BST0 via a boosting circuit C1 comprised of a capacitive element.

Further, the input nodes SN0 and SN1 of the first sense amplifier SA1 and the input nodes SN2 and SN3 of the second sense amplifier SA2 are supplied with the pre-charge voltage Vpre via transistors 171 through 174 which are turned on and off by a pre-charge signal PRE.

In this case, assuming that the sensitivity of the sense amplifiers SA1 and SA2 is $\Delta V$, the boosting circuits C0 and C1 boost by $3\Delta V$ the voltages at the input nodes SN0 and SN2 which are the input nodes on the voltage sensing side of the first and second sense amplifiers SA1 and SA2. The boosting circuit C2 boosts the input node SN2 by $2\Delta V$. In contrast to this, the boosting circuit C3 boosts the voltage at the input node SN3 which is the input node on the reference side of the second sense amplifier SA2.

That is, the boosting circuits C0 and C1 constitute a first voltage setting circuit, the boosting circuit C2 constitutes a third voltage setting circuit, and the boosting circuit C3 constitutes a second voltage setting circuit. Further, the transistors 167 through 170 constitute a selecting circuit.

It is to be noted that the first sense amplifier SA1 connected to the even-number bit lines BL2, . . . , the second sense amplifier SA2 connected to the odd-number bit lines BL3, . . . and so forth are constructed similarly to the cases of the sense amplifiers SA1 and SA2 connected to the even-number bit line BL0 and the odd-number bit line BL1.

In this case, it is assumed that the information retained in one memory cell CELL has four values (two bits). Further, for simplicity of explanation, it is assumed that the information in a state in which the transistor constituting the memory cell CELL has a high threshold voltage and no current flows is represented by "00", and the information is represented by "01", "10" and "11" in steps as the threshold voltage is reduced with an increasing current flow. Further, the selected memory cell is represented by CELL0. Therefore, the voltage level of a word line WL0 is "H", and the voltage levels of word lines WL1 through WLn, the bit line cutoff signal CUT1 and a discharge signal DIS1 are retained at "L".

Figure 10:
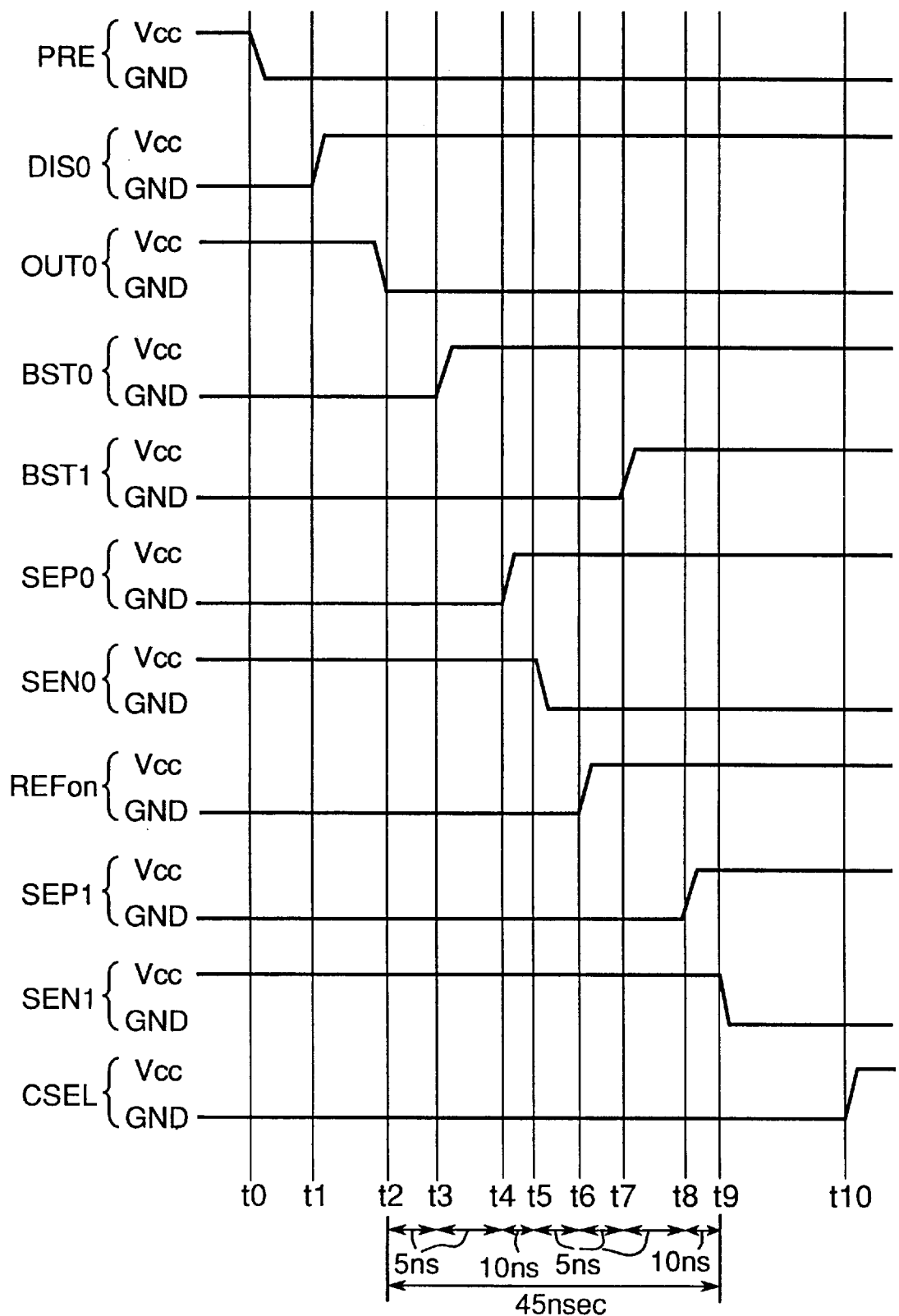
FIG. 10 is a timing chart of each portion of the semiconductor storage vice shown in FIG. 9 in the voltage sensing stage.

The read operation of the semiconductor storage device having the above construction will be described in detail below with reference to the timing chart of FIG. 10. It is to be noted that Figs. 11A through 11H show the voltages at input nodes in the operating stage shown in FIG. 10.

In this case, it is assumed that the level of the bit line cutoff signal CUT0 is at Vcc, the transistors 162, 165, 163, . . . are turned on and the input nodes SN0 and SN2 are connected to the bit line BL0. It is further assumed that the input nodes SN0 and SN1 of the first sense amplifier SA1, the input nodes SN2 and SN3 of the second sense amplifier SA2 and the bit line BL0 have already started to be charged by setting the level of the pre-charge signal PRE to Vcc.

First, at a time point t0, by reducing the level of the pre-charge signal PRE to GND, the pre-charging of the input nodes SN0 through SN3 and the bit line BL0 are completed.

Then, at a time point t1, with the level of the discharge signal DIS0 set to Vcc, the bit line BL1 is connected to a ground voltage Vss. When the information retained in the memory cell CELL0 is "00", neither one of the bit line BL0 and the input nodes SN0 and SN2 are discharged, and as shown in FIGS. 11A and 11B, the pre-charge voltage Vpre is retained. In contrast to this, when the information is "01", "10" or "11", the bit line BL0 and the input nodes SN0 and SN2 are discharged according to the information, and their voltages start to reduce from the pre-charge voltage Vpre as shown in FIGS. 11C through 11H.

Then, at a time point t2 at which the voltages at the bit line BL0 and the input nodes SN0 and SN2 are reduced from the pre-charge voltage vpre by $2\Delta V$ in the case where the information retained in the memory cell CELL0 is; "01" (see FIGS. 11C and 11D), by $4\Delta V$ in the case where the information is "10" (see FIGS. 11E and 11F) or by 6ΔV in the case where the information is "11" (see FIGS. 11G and 11H), the bit line cutoff signal CUT0 is set to GND, thereby disconnecting the input nodes SN0 and SN2 from the bit line BL0.

By operating the boosting circuit C0 and the boosting circuit C1 with the level of the boost signal BST0 set to Vcc at a time point t3, the voltages at the input nodes SN0 and SN2 are boosted by 3ΔV (one half of the maximum discharge voltage of 6ΔV) as shown in FIGS. 11A through 11H. When the information is "00" or "01" and the discharge voltage is not higher than 2ΔV, the voltages at the input nodes SN0 and SN2 become higher than the voltages at the input nodes SN1 and SN3 which serves as the reference voltage (i.e., the pre-charge voltage Vpre). In contrast to this, when the information is "10" or "11" and the discharge voltage is not lower than 4ΔV, the voltages at the input nodes SN0 and SN2 become lower than the pre-charge voltage Vpre which serves as the reference voltage.

Then, by setting the level of a sensing signal SEP0 to Vcc at the time point t4 and thereafter setting the level of a sensing signal SEN0 to GND at a time point t5, the first sense amplifier SA1 is operated. Then, as shown in FIGS. 11A, 11C, 11E and 11G, the potential difference between the input node SN0 and the input node SN1 is amplified to the voltage Vcc. It is to be noted that voltage at input node SN0>voltage at input node SN1 when the information is "00" or "01", and voltage at input node SN0<voltage at input node SN1 when the information is "10" or "11".

It is to be noted that the operations at the time points t3 to t5 are the same as the operations at the time points t3 to t5 of the first embodiment shown in FIG. 4.

By setting the level of the sensing result transfer signal REFon to Vcc at a time point t6 at which the operation of the first sense amplifier SA1 is completed, the input node to be boosted out of the input nodes SN2 and SN3 is set according to the voltages at the input nodes SN0 and SN1 (i.e., according to the sensing result of the first sense amplifier SA1).

In this case, when the information is "00" or "01" as shown in FIGS. 11B and 11D, the voltage at the input node SN2 is higher than the voltage at the input node SN3 at the time point t6. Therefore, even when the input node SN2 is boosted, it is impossible to discriminate between the information "00" and the information "01". Therefore, the input node SN3 (i.e., the reference voltage) is boosted. In contrast to this, when the information is "10" or "11" as shown in FIGS. 11F and 11H, the voltage at the input node SN3 is higher than the voltage at the input node SN2 at the time point t6. Therefore, even when the input node SN3 is boosted, it is impossible to discriminate between the information "10" and the information "11". Therefore, the input node SN2 is boosted.

Then, by setting the level of the boost signal BST1 to Vcc at a time point t7, the boosting circuit C2 and the boosting circuit C3 are operated.

In the above case, when the information is "00" or "01" as shown in FIGS. 11A and 11C, the level at the input node SN0 is "H", and the level at the input node SN1 is "L". Consequently, the transistor 169 is turned on and the transistor 167 is turned off. Therefore, the input node SN3 is boosted by 2ΔV via the transistor 169 by the boosting circuit C3. When the information is "00" as shown in FIG. 11B, the voltage at the input node SN2 becomes higher than the voltage (reference voltage) at the input node SN3. When the information is "00" as shown in FIG. 11D, the voltage at the input node SN2 becomes lower than the voltage (reference voltage) at the input node SN3.

In contrast to this, when the information is "10" or "11", the level at the input node SN0 is "L" and the level at the input node SN1 is "H", and therefore, the transistor 167 is turned on. Therefore, the input node SN2 is boosted by 2ΔV via the transistor 167 by the boosting circuit C2. When the information is "10" as shown in FIG. 11F, the voltage at the input node SN2 becomes higher than the voltage (reference voltage) at the input node SN3. When the information is "11" as shown in FIG. 11H, the voltage at the input node SN2 becomes lower than the voltage (reference voltage) at the input node SN3.

Then, by setting the level of a sensing signal SEP1 to Vcc at a time point t8 and thereafter setting the level of a sensing signal SEN1 to GND at a time point t9, the second sense amplifier SA2 is operated. Then, as shown in FIGS. 11B, 11D, 11F and 11H, the potential difference between the input node SN2 and the input node SN3 is amplified to the voltage Vcc. It is to be noted that voltage at input node SN2>voltage at input node SN3 when the information is "00" or "10", and voltage at input node SN2<voltage at input node SN3 when the information is "01" or "11".

By setting the level of a column selection signal CSEL to Vcc at a time point t10 at which the operation of the second sense amplifier SA2 is almost completed, the input nodes SN0, SN1, SN2 and SN3 are connected to a data line 175. Then, by reading the voltages at the input nodes SN0, SN1, SN2 and SN3, the read operation of the information retained in the memory cell CELL0 is completed.

It is to be noted that the decision of the information retained in the memory cell CELL0 based on the voltages at the input nodes SN0, SN1, SN2 and SN3 read via the data line 175 is executed as follows.

| 1st sense amp. SA1 | 2nd sense amp. SA2 | information |
| --- | --- | --- |
| SN0: H, SN1: L | SN2: H, SN3: L | → "00" |
| SN0: H, SN1: L | SN2: L, SN3: H | → "01" |
| SN0: L, SN1: H | SN2: H, SN3: L | → "10" |
| SN0: L, SN1: H | SN2: L, SN3: H | → "11" |

Figure 12:
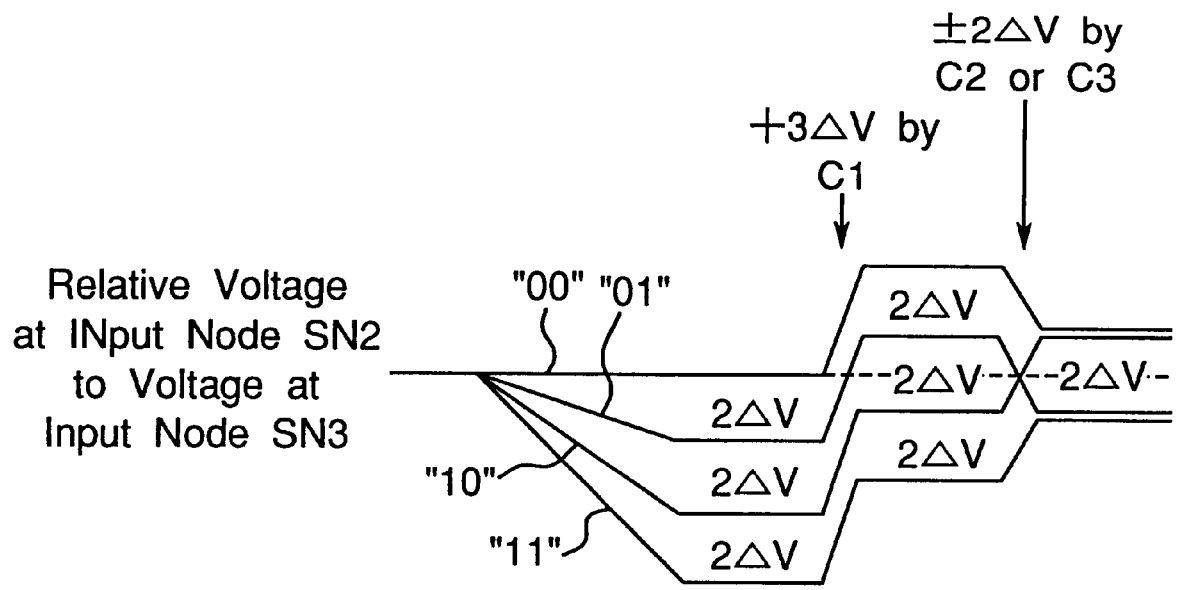
FIG. 12 is a chart showing a relative value of an input node SN2 with respect to an input node SN3 in the operation based on FIG. 10.

FIG. 12 shows a relative value of the voltage at the input node SN2 of the second sense amplifier SA2 with respect to the voltage (reference voltage) at the input node SN3. In this case, the boosting operation of the input node SN0 by the boosting circuit C0 is the same as the boosting operation of the input node SN2 by the boosting circuit C1. FIG. 12 clearly shows the fact that the discrimination between the information "00", "01" and the information "10", "11" (i.e., "0" and "1" of the high-order bit of the consecutive two bits) is enabled by the boosting operations of the boosting circuits C0 and C1 and the fact that the discrimination between the information "00", "10" and the information "01", "11" (i.e., "0" and "1" of the bit next to the high-order bit of the consecutive two bits) is enabled by the boosting operations of the boosting circuits C2 and C3.

Thus, in the present embodiment, after the memory cell CELL0 is selected and the voltages at the input nodes SN0 and SN2 of the first and second sense amplifiers SA1 and SA2 are made lower than the pre-charge voltage Vpre by the voltage corresponding to the information retained in the selected memory cell CELL0, then the voltages at the input nodes SN0 and SN2 are boosted by one half (3ΔV) of the maximum discharge voltage by the operations of the boosting circuits C0 and C1. Thus, with the voltage at the input node SN0 when the retained information is "00" or "01" made higher than the pre-charge voltage Vpre, the first sense amplifier SA1 discriminates between "0" and "1" of the high-order bit of the retained information.

When the high-order bit of the retained information is "0" (i.e., when the voltage at the input node SN0>the voltage at the input node SN1), the voltage at the input node SN3 on the reference side of the second sense amplifier SA2 is boosted by $2\Delta V$ by the operation of the boosting circuit C3. When the high-order bit of the retained information is "1" (i.e., when the voltage at the input node SN0<the voltage at the input node SN1), the voltage at the input node SN2 on the voltage sensing side of the second sense amplifier SA2 is boosted by $2\Delta V$ by the operation of the boosting circuit C2. Thus, with the voltage at the input node SN2 when the retained information is "00" or "10" made higher than the reference voltage, the second sense amplifier SA2 discriminates between "0" and "1" of the bit next to the high-order bit of the retained information.

That is, in the present embodiment, the first sense amplifier SA1 can directly use the pre-charge voltage Vpre at the input node SN1 as a reference voltage, while the second sense amplifier SA2 can directly use the pre-charge voltage Vpre at the input node SN3 or the voltage boosted by $2\Delta V$ as the reference voltage. Therefore, the retained information of four values can be read without using the three types of reference voltages generated by the three reference voltage generating circuits in contrast to the prior art nonvolatile semiconductor storage device.

Therefore, according to the present embodiment, a semiconductor storage device in which an increase in number of circuits due to the multi-valued construction is suppressed can be provided.

Fourth Embodiment

The present embodiment is related to a semiconductor storage device in which an increase in access time due to the multi-valued construction is suppressed.

Figure 13:
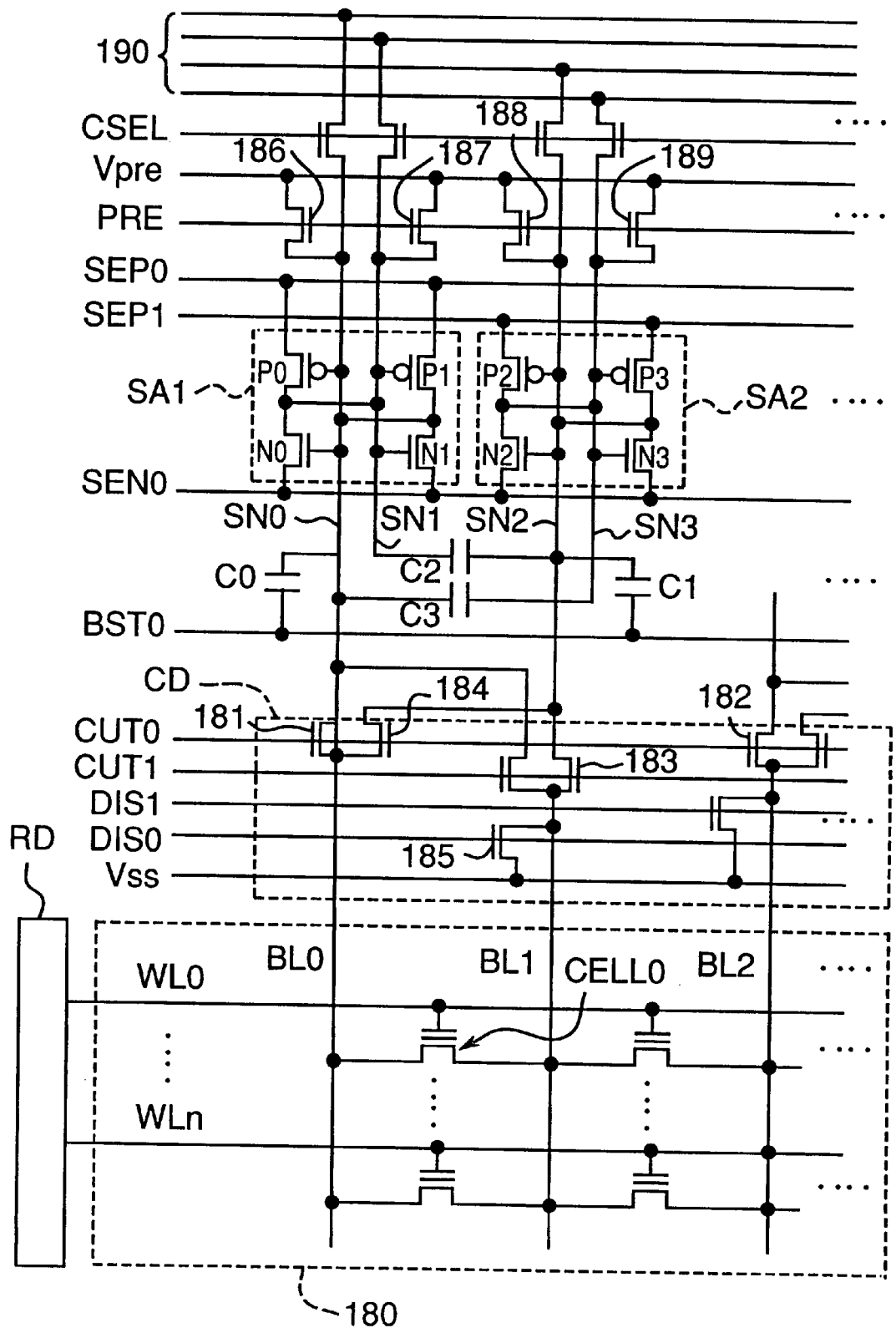
FIG. 13 is a circuit diagram of a sense amplifier and its peripheries according to an example of a semiconductor storage device in which an increase in access time due to a multi-valued construction is suppressed by the present invention.

FIG. 13 is a circuit diagram mainly showing a memory cell array and sense amplifiers of a semiconductor storage device of the present embodiment.

A memory cell array 180, a first sense amplifier SA1, a second sense amplifier SA2, transistors 181 through 185, transistors 186 through 189, a row decoder RD and a column decoder CD have the same constructions and operations as those of the memory cell array 161, first sense amplifier SA1, second sense amplifier SA2, transistors 162 through 166, transistors 171 through 174, row decoder RD, column decoder CD of the semiconductor storage device of the third embodiment shown in FIG. 9.

The input node SN0 of the first sense amplifier SA1 is connected to the input line of the boost signal BST0 via the boosting circuit C0 comprised of a capacitive element. Similarly, the input node SN2 is connected to the input line of the boost signal BST0 via the boosting circuit C1 comprised of a capacitive element. Further, the input node SN1 is connected to the input node SN2 via the boosting circuit C2 comprised of a capacitive element. Similarly, the input node SN0 is connected to the input node SN3 via the boosting circuit C3 comprised of a capacitive element.

In this case, assuming that the sensitivity of the sense amplifiers SA1 and SA2 is $\Delta V$, the boosting circuits C0 and C1 boost by $3\Delta V$ the voltages at the input nodes SN0 and SN2 which are the input nodes on the voltage sensing side of the first and second sense amplifiers SA1 and SA2. In contrast to this, the boosting circuit C3 boosts by $2\Delta V$ the voltage at the input node SN3 on the reference side of the second sense amplifier SA2 when the voltage at the input node SN0 is increased. Similarly, the boosting circuit C2 boosts by $2\Delta V$ the voltage at the input node SN2 on the voltage sensing side of the second sense amplifier SA2 when the voltage at the input node SN1 is increased.

That is, the boosting circuits C0 and C1 constitute a voltage setting circuit.

In this case, it is assumed that the selected memory cell is CELL0, the voltage level at the word line WL0 is "H", and the voltage levels at the word lines WL1 through WLn, the bit line cutoff signal CUT1 and the discharge signal DIS1 are retained at "L" similarly to the third embodiment.

Figure 14:
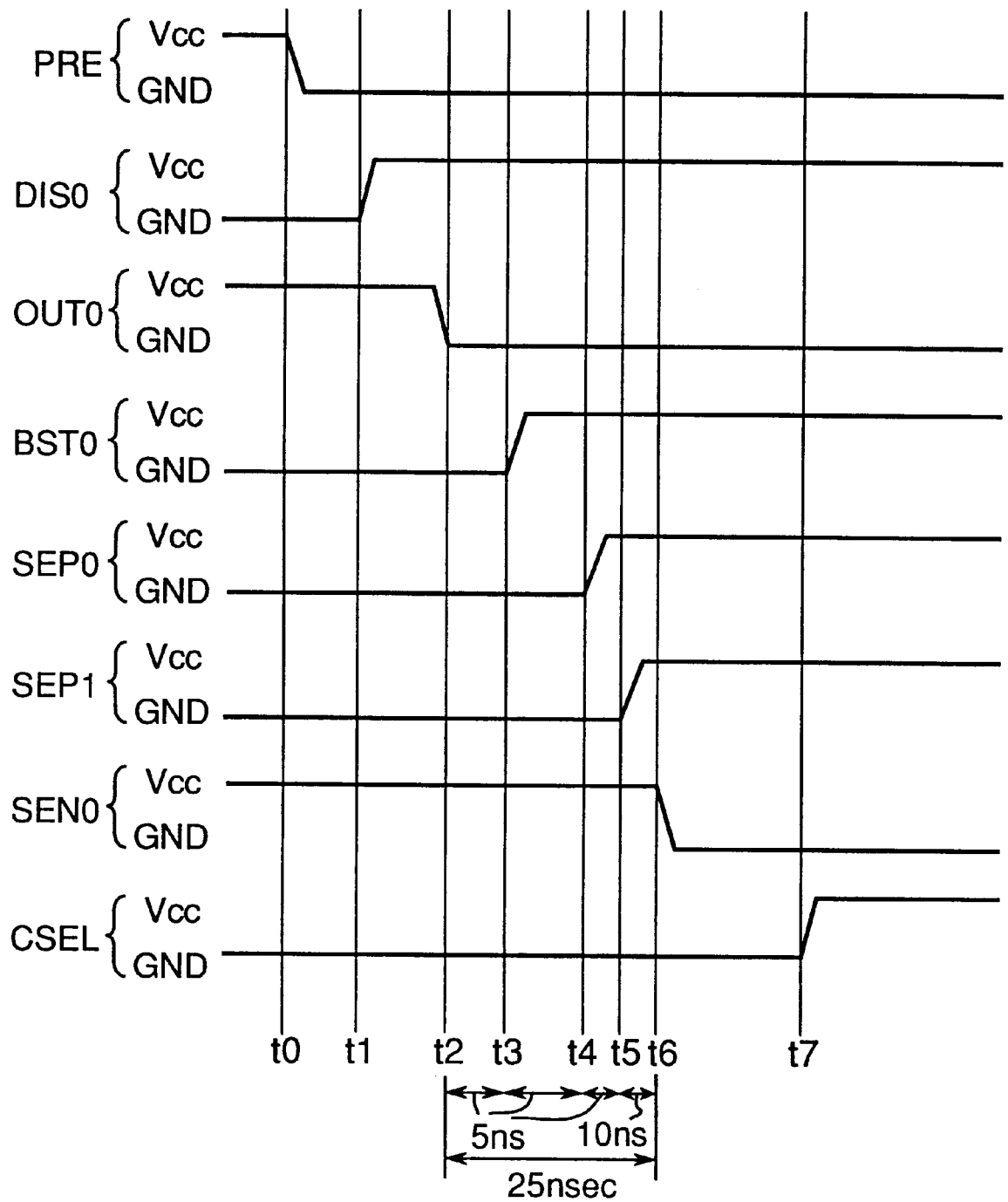
FIG. 14 is a timing chart of each portion of the semiconductor storage device shown in FIG. 13 in the voltage sensing stage.

The read operation of the semiconductor storage device having the above construction will be described in detail below with reference to the timing chart of FIG. 14. It is to be noted that FIGS. 15A through 15H show the voltages at input nodes in the operating stage shown in FIG. 14.

In this case, it is assumed that the level of the bit line cutoff signal CUT0 is at Vcc, the transistors 181, 184, 182, . . . are turned on and the input nodes SN0 and SN2 are connected to the bit line BL0. It is further assumed that the input nodes SN0 and SN1 of the first sense amplifier SA1, the input nodes SN2 and SN3 of the second sense amplifier SA2 and the bit line BL0 have already started to be charged with the level of the pre-charge signal PRE set to Vcc.

Similarly to the third embodiment, the pre-charging of the input nodes SN0 through SN3 and the bit line BL0 is completed at a time point t0, and the bit line BL1 is connected to a ground voltage Vss at a time point t1. Then, at a time point t2 at which the voltages at the bit line BL0 and the input nodes SN0 and SN2 are reduced from the pre-charge voltage Vpre by $2\Delta V$ in the case where the information retained in the memory cell CELL0 is "01", by $4\Delta V$ in the case where the information is "10" or by $6\Delta V$ in the case where the information is "11", the input nodes SN0 and SN2 are disconnected from the bit line BL0.

Further, the boosting circuit C1 and the boosting circuit C1 are operated at a time point t3, so that the voltages at the input nodes SN0 and SN2 are boosted by $3\Delta V$ (one half of the maximum discharge voltage of $6\Delta V$) as shown in FIGS. 15A through 15H. Consequently, when the information is "00" or "01", the voltages at the input nodes SN0 and SN2 become higher than the voltages at the input nodes SN1 and SN3 which serve as the reference voltage (i.e., the pre-charge voltage Vpre). In contrast to this, when the information is "10" or "11", the voltages at the input nodes SN0 and SN2 become lower than the pre-charge voltage Vpre which serves as the reference voltage.

Then, with the level of the sensing signal SEP0 set to Vcc at a time point t4, only the p-channel transistors P0 and P1 of the first sense amplifier SA1 are operated. Then, as shown in FIGS. 15A and 15C, when the information is "00" or "01", the voltage at the input node SN0 side abruptly increases since the voltage at the input node SN0 is higher than the pre-charge voltage Vpre which serves as the reference voltage. In contrast to this, as shown in FIGS. 15E and 15G, when the information is "10" or "11", the voltage at the input node SN1 side abruptly increases since the voltage at the input node SN0 is lower than the pre-charge voltage Vpre which serves as the reference voltage.

When the sensing operation by the p-channel transistors P0 and P1 of the first sense amplifier SA1 is thus started, the voltage variations at the input nodes SN0 and SN1 are transmitted to the input nodes SN2 and SN3 of the second sense amplifier SA2.

For example, when the information is "00" or "11" and the voltage at the input node SN0 is increased, the voltage at the input node SN3 is boosted by $2\Delta V$ by the boosting circuit C3. When the information is "10" or "11" and the voltage at the input node SN1 is increased, the voltage at the input node SN2 is boosted by 2ΔV by the boosting circuit C2.

It is to be noted that the transmission of the sensing result by the p-channel transistors P0 and P1 of the first sense amplifier SA1 to the input nodes SN2 and SN3 is executed in a very short time (e.g., 5 nsec).

In this case, the voltage at the input node SN3 is boosted by 2ΔV when the information is "00". However, the voltage at the input node SN2 has been already made higher by 3ΔV than the voltage at the input node SN3 by the boosting operation of the boosting circuit C1, and therefore, the voltage at the input node SN2 is higher than the voltage at the input node SN3 as a result.

When the information is "01", the voltage at the input node SN2 is slightly higher by ΔV than the voltage at the input node SN3 by the boosting operation by the boosting circuit C1. Therefore, as a consequence of the boosting of the voltage at the input node SN3 by 2ΔV, the voltage at the input node SN3 becomes higher than the voltage at the input node SN2 as a result.

When the information is "10", the voltage at the input node SN3 is slightly higher by ΔV than the voltage at the input node SN2 by the boosting operation by the boosting circuit C1. Therefore, as a consequence of the boosting of the voltage at the input node SN2 by 2ΔV, the voltage at the input node SN2 becomes higher than the voltage at the input node SN3 as a result.

When the information is "11", the voltage at the input node SN3 is already higher by 3ΔV than the voltage at the input node SN2. Therefore, even when the voltage at the input node SN2 is boosted by 2ΔV, the voltage at the input node SN3 is higher than the voltage at the input node SN2.

Thus, with the level of the sensing signal SEP1 set to Vcc at a time point t5 at which a potential difference is surely generated between the input nodes SN2 and SN3, p-channel transistors P2 and P3 of the second sense amplifier SA2 are operated. Then, with the level of the sensing signal SEN0 set to GND at a time point t6, n-channel transistors N0 through N3 of the first and second sense amplifiers SA1 and SA2 are operated. Then, as shown in FIGS. 15A through 15H, the potential difference between the input nodes SN0 and SN1 and the potential difference between the input nodes SN2 and SN3 are amplified to the voltage Vcc. It is to be noted that voltage at input node SN2>voltage at input node SN3 when the information is "00" or "10", and voltage at input node SN2<voltage at input node SN3 when the information is "01" or "11".

At a time point t7 at which the operation of the second sense amplifier SA2 is almost completed, the level of the column selection signal CSEL is set to Vcc and the input nodes SN0, SN1, SN2 and SN3 are connected to a data line 190. Then, by reading the voltages at the input nodes SN0, SN1, SN2 and SN3, the read operation of the information retained in the memory cell CELL0 is completed.

Thus, in the present embodiment, after the memory cell CELL0 is selected and the voltages at the input nodes SN0 and SN2 of the first and second sense amplifiers SA1 and SA2 are made lower than the pre-charge voltage Vpre by the voltage corresponding to the information retained in the selected memory cell CELL0, then the voltages at the input nodes SN0 and SN2 are boosted by one half (3ΔV) of the maximum discharge voltage by the operations of the boosting circuits C0 and C1. Then, only the p-channel transistors P0 and P1 of the first sense amplifier SA1 are operated. Consequently, when the voltage at the input node SN0 is higher than the voltage at the input node SN1, the voltage at the input node SN3 on the reference side of the second sense amplifier SA2 is boosted by 2ΔV by the operation of the boosting circuit C3. When the voltage at the input node SN0 is lower than the voltage at the input node SN1, the voltage at the input node SN2 on the voltage sensing side of the second sense amplifier SA2 is boosted by 2ΔV by the operation of the boosting circuit C2. Subsequently, the p-channel transistors P2 and P3 of the second sense amplifier SA2 and the n-channel transistors N0 through N3 of the first and second sense amplifiers SA1 and SA2 are operated to discriminate between "00", "01", "10" and "11" of the retained information.

Figure 22:
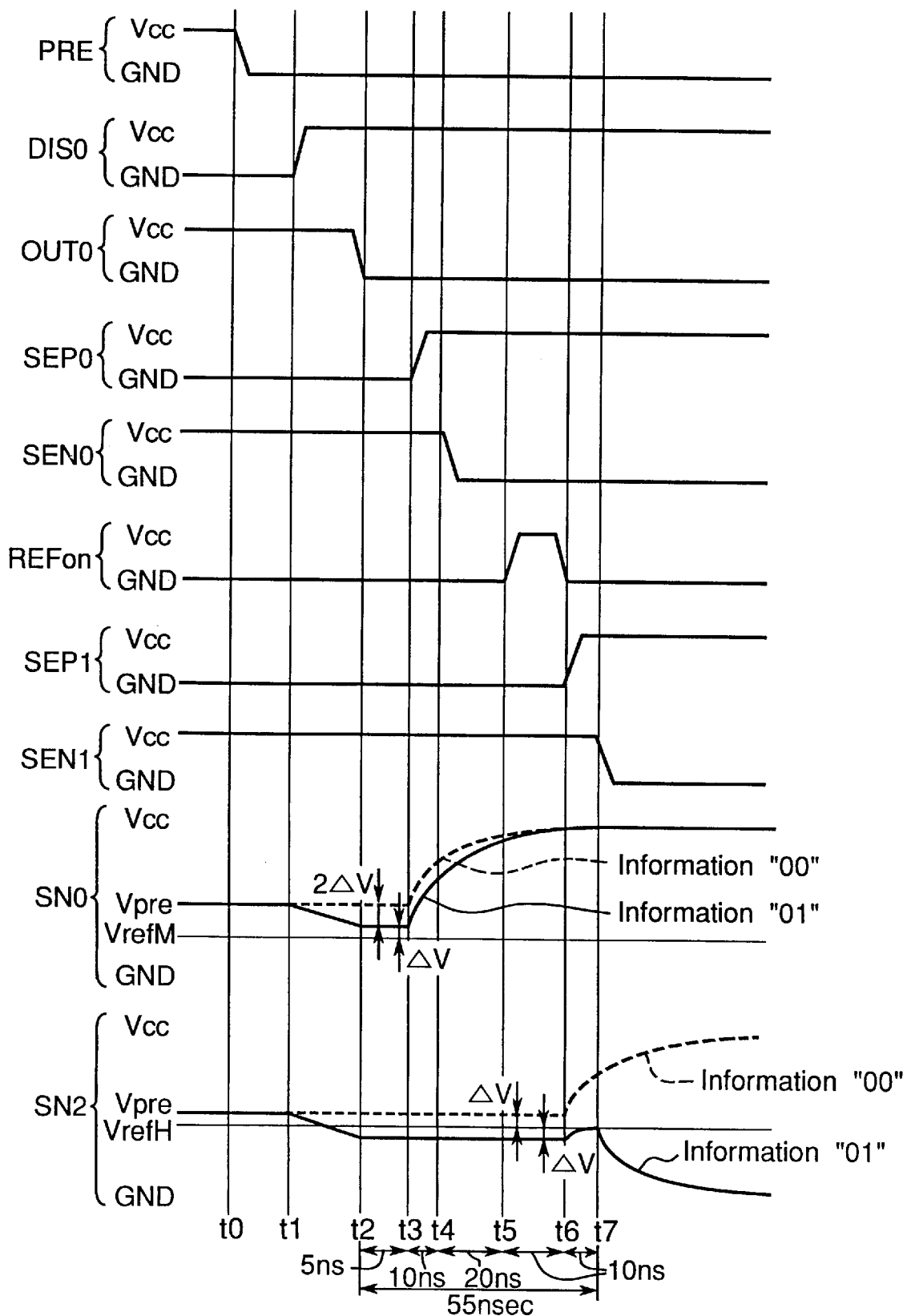
FIG. 22 is a timing chart when "00" or "01" is stored in the nonvolatile semiconductor storage device shown in FIG. 21.
Figure 23:
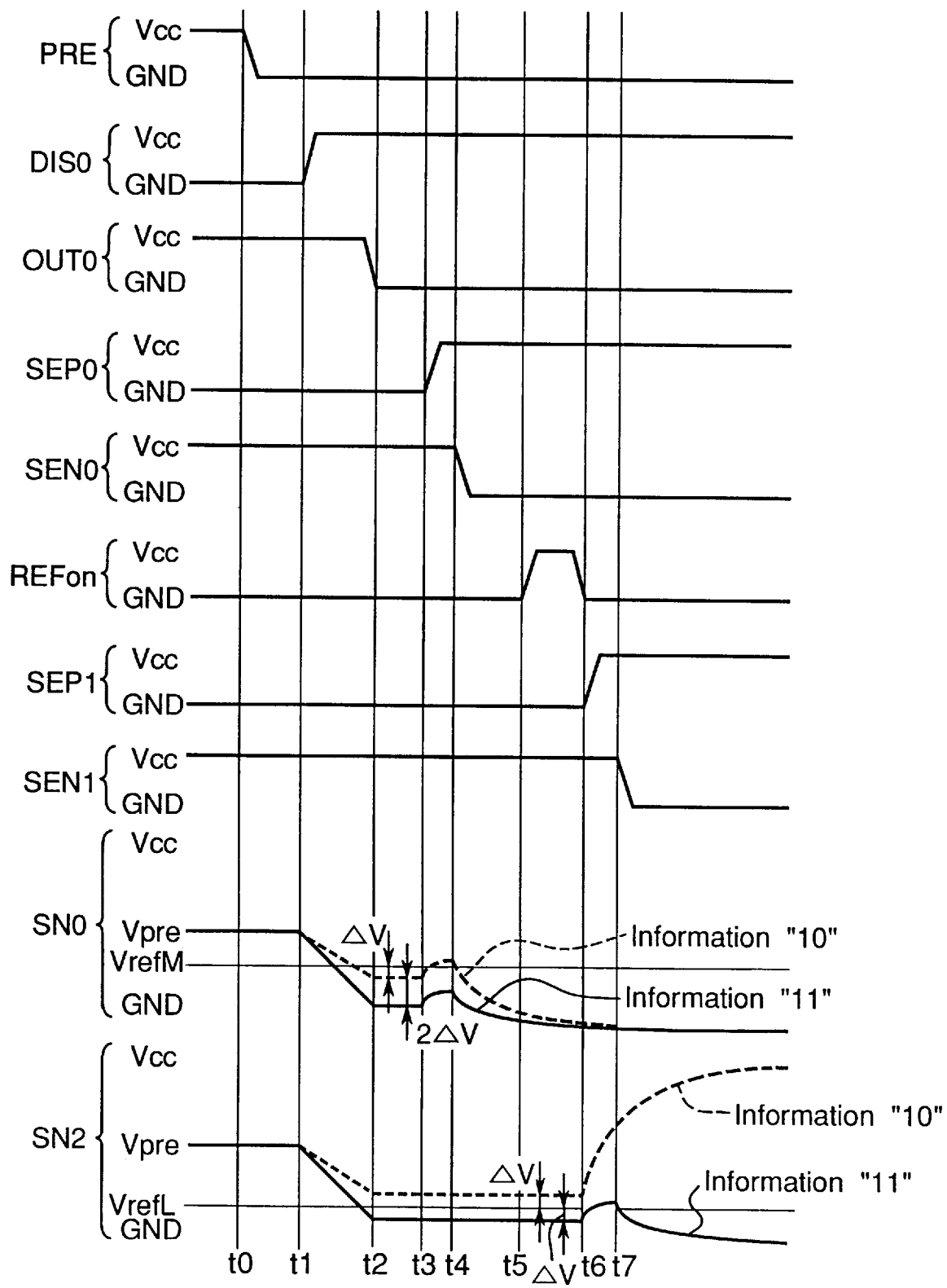
FIG. 23 is a timing chart when "10" or "11" is stored in the nonvolatile semiconductor storage device shown in FIG. 21.

Therefore, the transistors constituting the sense amplifiers SA are operated with a time difference provided between them at the start of the operations in the present embodiment, however, the substantial sensing operation is required to be operated only once. That is, according to the present embodiment, as shown in FIG. 14, the time of t2 to t6 from the disconnection of the input nodes SN0 and SN2 from the bit line BL0 to the completion of the sensing operation by the second sense amplifier SA2 is made to be 25 nsec, meaning that the operating time can be remarkably reduced as compared with the time of 55 nsec of the prior art nonvolatile semiconductor storage device in which the sensing operation is executed two times by the first sense amplifier SA1 and the second sense amplifier SA2 (see FIG. 22) and the time of 45 nsec in the third embodiment (see FIG. 10).

Thus, according to the present embodiment, a semiconductor storage device in which an increase in access time due to the multi-valued construction is suppressed can be provided.

Fifth Embodiment

Figure 16:
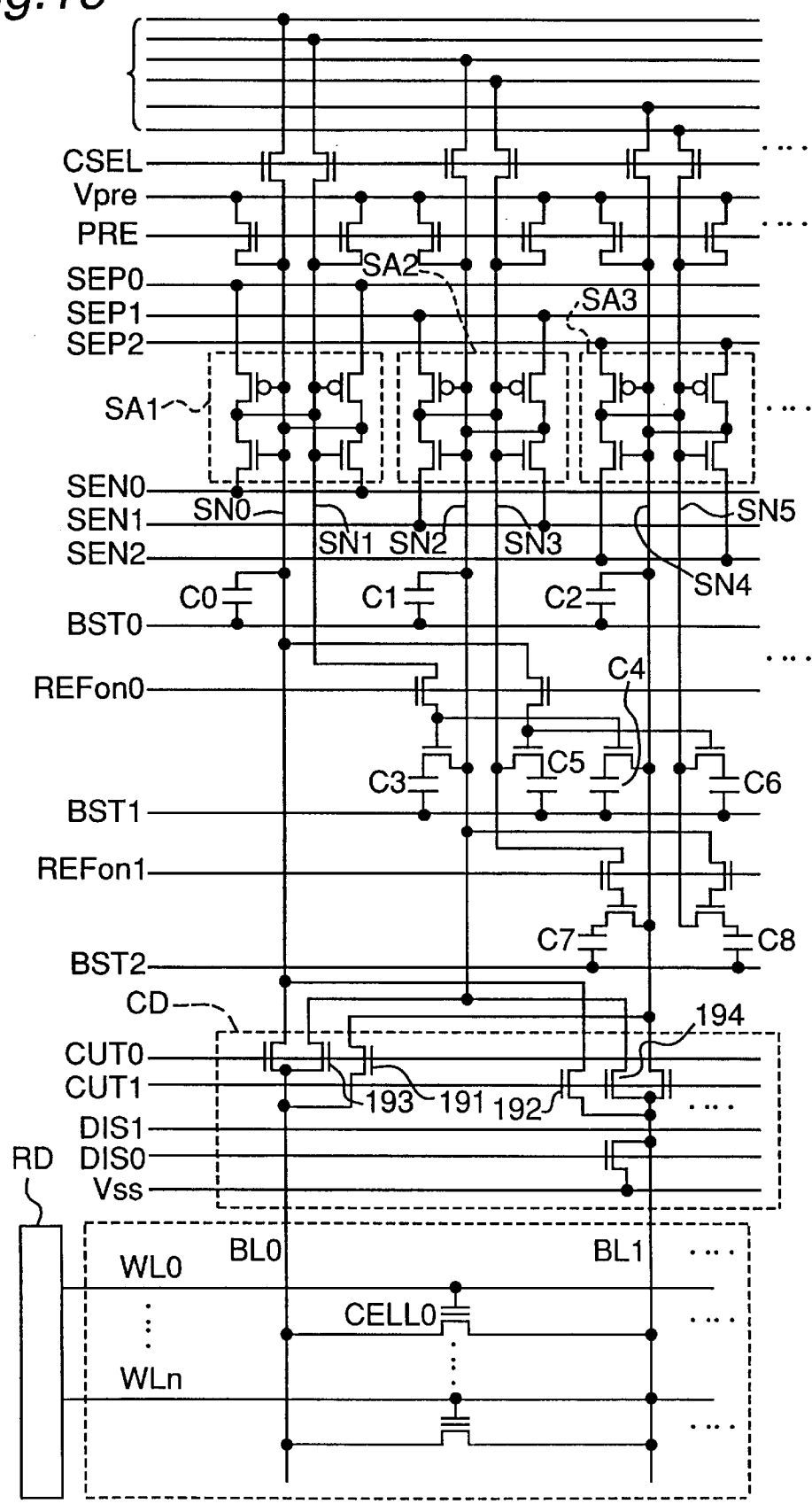
FIG. 16 is a circuit diagram of a sense amplifier and its peripheries of a semiconductor storage device different from FIG. 9, in which an increase in number of circuits due to a multi-valued construction is suppressed by the present invention.

FIG. 16 is a circuit diagram mainly showing a memory cell array and sense amplifiers SA1, SA2 and SA3 of a semiconductor storage device obtained by altering the semiconductor storage device shown in FIG. 9 for the achievement of an 8-value (3-bit) construction.

In the present embodiment, an even-number bit line BL0 and an odd-number bit line BL1 are connected to each other via a transistor 191 which is turned on and off by a bit line cutoff signal CUT0. Similarly, they are connected to each other via a transistor 192 which is turned on and off by a bit line cutoff signal CUT1. Then, the odd-number bit line BL1 is connected to an input node SN4 of a third sense amplifier SA3.

Further, the even-number bit line BL0 and the odd-number bit line BL1 are connected to each other via a transistor 193 which is turned on and off by the bit line cutoff signal CUT0 and a transistor 194 which is turned on and off by the bit line cutoff signal CUT1. Then, an input node SN2 of the second sense amplifier SA2 is connected to between the transistors 193 and 194.

Further, when boosting circuits C0, C1 and C2 operate, input nodes SN0, SN2 and SN4 are boosted by 7ΔV. Further, based on the voltage at an input node SN1, the input nodes SN2 and SN4 are each boosted by 4ΔV by boosting circuits C3 and C4. Further, based on the voltage at the input node SN0, the input nodes SN3 and SN5 are each boosted by 4ΔV by boosting circuits C5 and C6. Further, based on the voltage at the input node SN3, the input node SN4 is boosted by 2ΔV by a boosting circuit C7. Further, based on the voltage at the input node SN2, the input node SN5 is boosted by 2ΔV by a boosting circuit C8.

Figure 17:
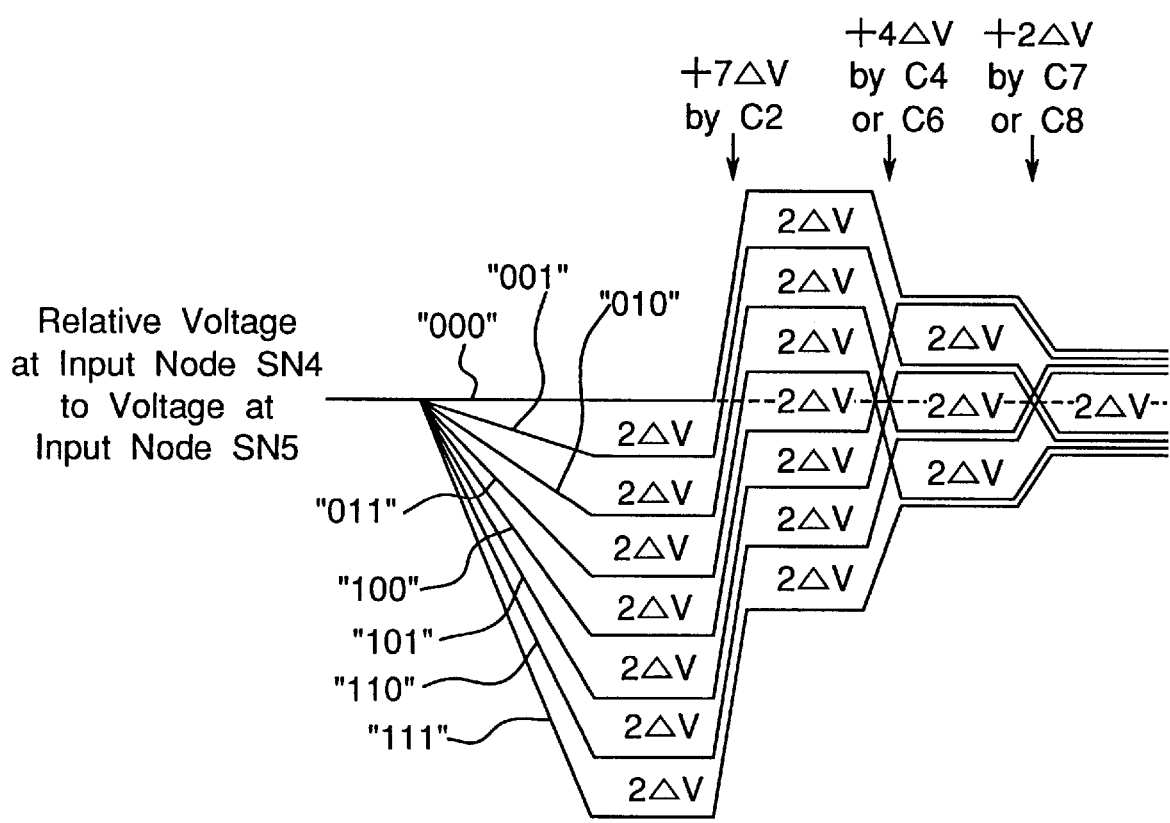
FIG. 17 is a diagram showing a relative value of an input node SN4 with respect to an input node SN5 in the operating stage of the semiconductor storage device shown in FIG. 16.

FIG. 17 shows a relative value of the voltage at the input node SN4 of the third sense amplifier SA3 with respect to the voltage (reference voltage) at the input node SN5. In this case, the operation of boosting the input nodes SN0 and SN2 by the boosting circuits C0 and C1 is the same as the operation of boosting the input node SN4 by the boosting circuit C2. Further, the operation of boosting the input nodes SN2 and SN3 by the boosting circuits C3 and C5 is the same as the operation of boosting the input nodes SN4 and SN5 by the boosting circuits C4 and C6. FIG. 17 clearly shows the fact that the discrimination between "0" and "1" of the third bit of the 3-bit information is enabled by the boosting operation of the boosting circuits C0, C1 and C2, the discrimination between "0" and "1" of the second bit is enabled by the boosting operation of the boosting circuits C3 through C6 and the discrimination between "0" and "1" of the first bit can be achieved by the boosting operations of the boosting circuits C7 and C8.

Sixth Embodiment

Figure 18:
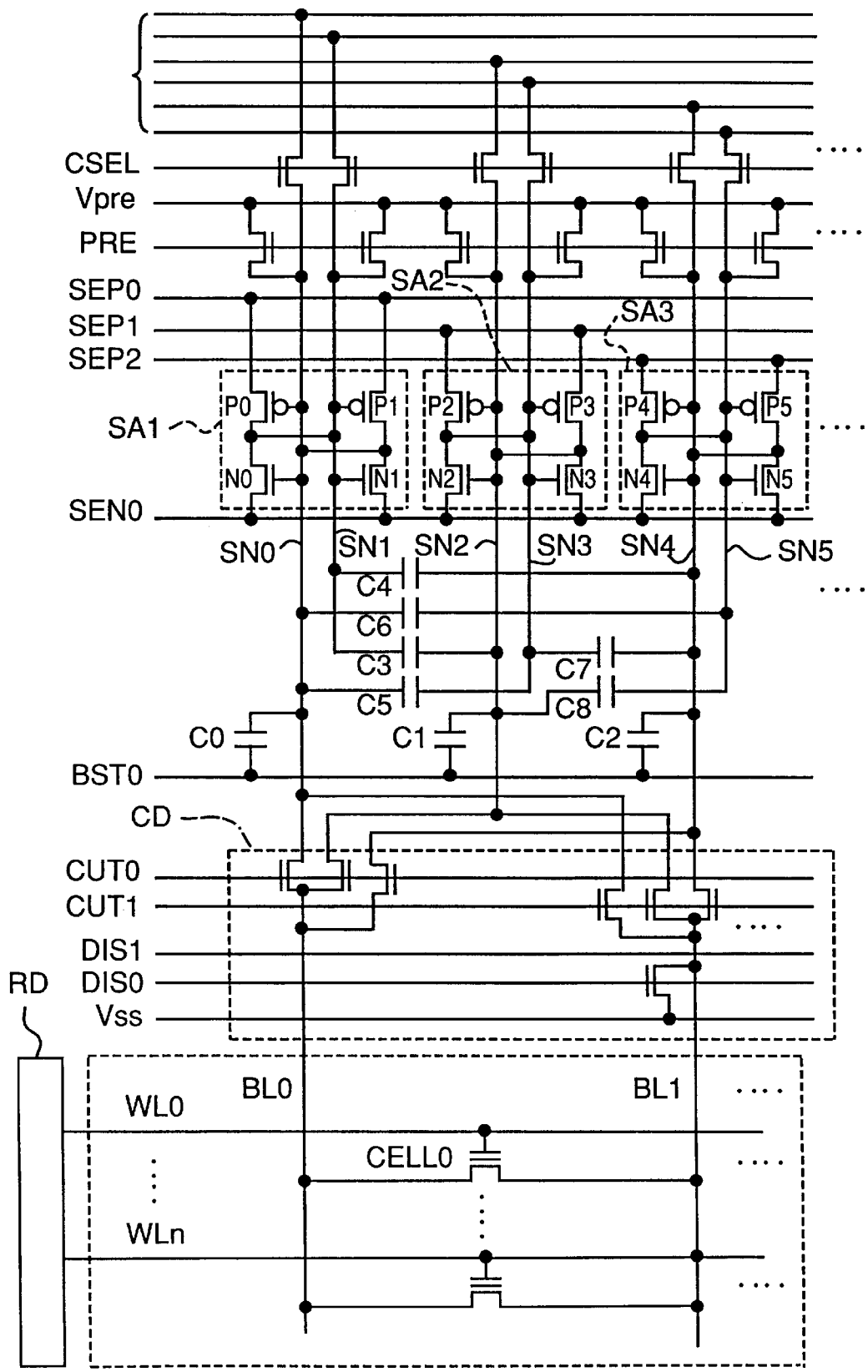
FIG. 18 is a circuit diagram of a sense amplifier and its peripheries of a semiconductor storage device different from FIG. 13, in which an increase in access time is suppressed.
Figure 19:
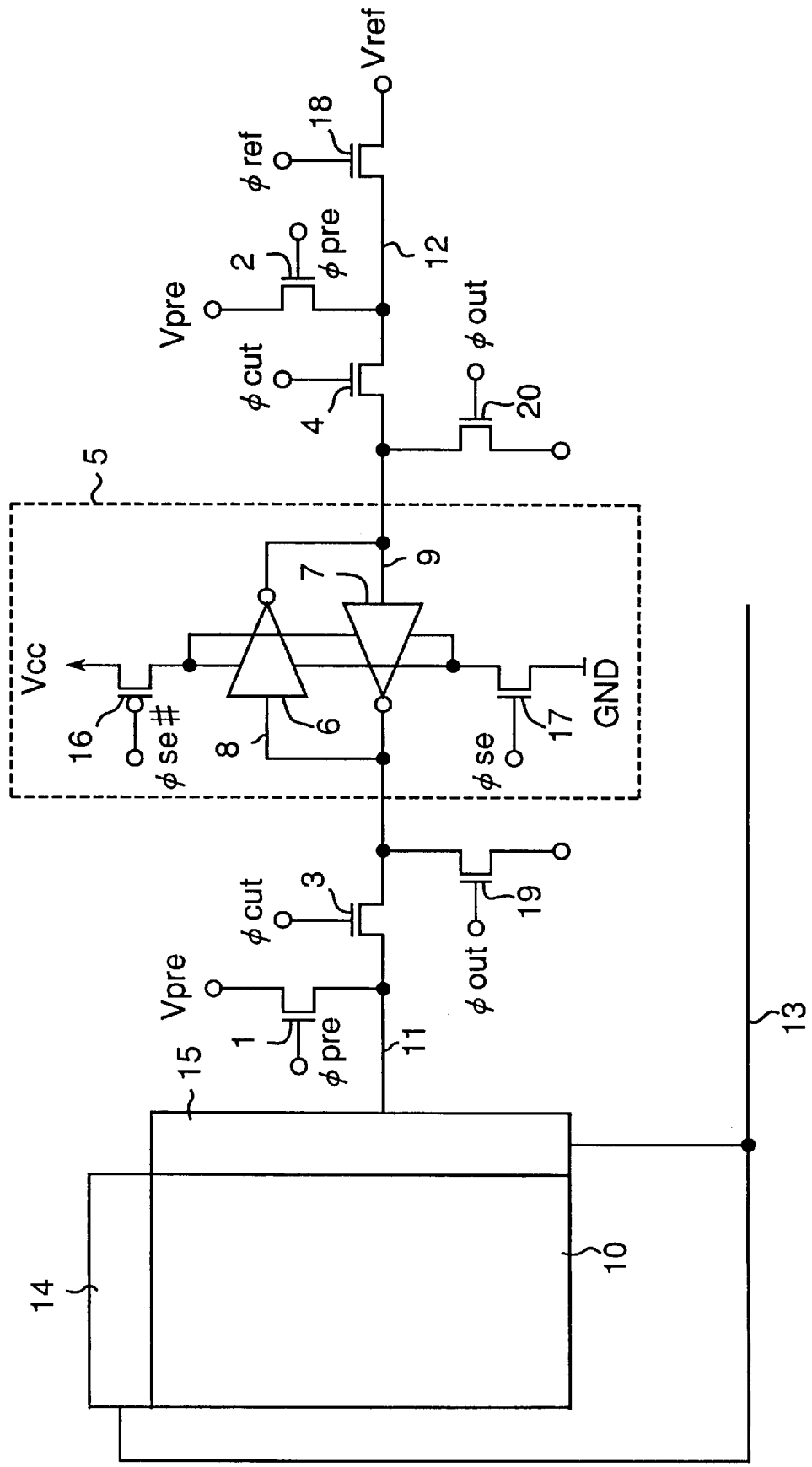
FIG. 19 is a block diagram of a prior art nonvolatile semiconductor storage device.

FIG. 18 is a circuit diagram mainly showing a memory cell array and sense amplifiers SA1, SA2 and SA3 of a semiconductor storage device obtained by altering the semiconductor storage device shown in FIG. 13 for the achievement of an 8-value (3-bit) construction.

The relation of connection between the even-number bit line BL0 and the odd-number bit line BL1 and the relation of connection between the bit lines BL0 and BL1 and the first through third sense amplifiers SA1 through SA3 of the present embodiment are the same as those of the semiconductor storage device shown in FIG. 16.

In the present embodiment, the input nodes SN0, SN2 and SN4 are boosted by $7\Delta V$ by the operations of the boosting circuits C0, C1 and C2. Then, the p-channel transistors P0 and P1 of the first sense amplifier SA1 are operated, and when voltage at input node SN0>voltage at input node SN1 the voltage at the input node SN3 on the reference side of the second sense amplifier SA2 is boosted by $4\Delta V$ by the operation of the boosting circuit C5. Further, the voltage at the input node SN5 on the reference side of the third sense amplifier SA3 is boosted by $4\Delta V$ by the operation of the boosting circuit C6. When voltage at input node SN0<voltage at input node SN1 the voltage at the input node SN2 on the voltage sensing side of the second sense amplifier SA2 is boosted by $4\Delta V$ by the operation of the boosting circuit C3. The voltage at the input node SN4 on the voltage sensing side of the third sense amplifier SA3 is boosted by $4\Delta V$ by the operation of the boosting circuit C4.

Further, the p-channel transistors P2 and P3 of the second sense amplifier SA2 are operated, and when voltage at input node SN2>voltage at input node SN3 the voltage at the input node SN5 on the reference side of the third sense amplifier SA3 is boosted by $2\Delta V$ by the operation of the boosting circuit C8. When voltage at input node SN2<voltage at input node SN3 the voltage at the input node SN4 on the voltage sensing side of the third sense amplifier SA3 is boosted by $2\Delta V$ by the operation of a boosting circuit C7.

As a result, the relative value of the voltage at the input node SN4 of the third sense amplifier SA3 with respect to the voltage (reference voltage) at the input node SN5 varies approximately similarly to the variation shown in FIG. 17. Therefore, the discriminate between eight values can be achieved by executing the sensing operation substantially one time.

Although the fifth and sixth embodiments have been described on the 8-value (3-bit) memory cell, a similar arrangement can be achieved with a 16-value (4-bit) memory cell.

Furthermore, the boosting circuits C1 through C8 of the third through sixth embodiments may be formed of an oxide film interposed between two polysilicon layers or of a MOS capacitor. Their capacitance values or boosting values can be easily set by changing the mask in forming a circuit, switching a switching circuit after the formation of the circuit or changing the voltages of "H" level of the boost signals BST0 and BST1.

The capacitance value setting as described above can be achieved with higher accuracy than when a lot of reference voltages Vref which differ from the pre-charge voltage Vpre by not less than the sensing sensitivity $\Delta V$ are provided. Therefore, this device is most suitable for the multiple value sensing operation which requires a higher accuracy and a high operating speed.

Furthermore, the transistors of the memory cells CELL of the third through sixth embodiments are n-channel transistors, however, p-channel transistors can be also used.

Furthermore, a virtual ground system memory cell array is used as the memory cell array in the aforementioned embodiments, however, a memory cell array of the ordinary NAND type, NOR type or DINOR type can be also used. Furthermore, for the memory cell, all sorts of flash memories including the split-gate type and also general nonvolatile memories such as EEPROM or mask ROM can be each used. Furthermore, not only the random access type but also the serial access type can be used.

As described above, the semiconductor storage device of the present invention operates to connect the second input terminal of the sense amplifier to the data line by the switching circuit, pre-charge the first and second input terminals by the pre-charging circuit, select one nonvolatile memory cell by the row decoding circuit and the column decoding circuit thereby connecting the data line to the bit line, disconnect the second input terminal from the data line by the switching circuit after a lapse of a sufficient time necessary for the voltage at the second input terminal to reduce (or increase) by two times the boosted voltage (or deboosted voltage) of the voltage setting circuit, and boost (or deboost) the voltage at the second input terminal by a specified voltage by the voltage setting circuit. With this arrangement, no matter whether the information of the selected nonvolatile memory cell is "0" or "1", a voltage difference of the boosted voltage (or deboosted voltage) between the voltage at the second input terminal and the pre-charge voltage can be provided.

Therefore, the pre-charge voltage at the first input terminal can be directly used as the reference voltage of the sense amplifier. That is, according to the present invention, there is no need for waiting the time necessary for the voltage at the second input terminal to reduce from the pre-charge level to the reference level, allowing the sensing time to be reduced by that much.

Furthermore, by setting the specified voltage boosted (or deboosted) by the voltage setting circuit as the specified voltage corresponding to the sensing sensitivity, the voltage difference between the first and second input terminals can be made to be the sensing sensitivity. Furthermore, the total discharge voltage in the above case is about two times the sensing sensitivity, and therefore, the present semiconductor storage device can operate with a small current.

Therefore, even when a number of nonvolatile memory cells are connected to the extension bit line, the sensing time can be reduced without impairing the sensing sensitivity.

According to the pre-charging circuit of the semiconductor storage device of one embodiment, the first and second input terminals are pre-charged with an equal voltage. With this arrangement, the potential difference between the voltage at the second input terminal and the voltage (pre-charge voltage) at the first input terminal can be made equal to each other no matter whether the information of the selected nonvolatile memory cell is "0" or "1".

Therefore, the information of the selected nonvolatile memory cell can be surely decided with the pre-charge voltage at the first input terminal used as the reference voltage of the sense amplifier.

Furthermore, the semiconductor storage device of one embodiment has two sets respectively including the memory cell array, the row decoding circuit, the column decoding circuit and the data line. In the device, the first and second input terminals of the sense amplifier are connected to different data lines by the two switching circuits, and either one of the two voltage setting circuits which boost (or deboost) the voltages at the first and second input terminals by the aforementioned specified voltage is selectively operated by the selecting circuit. With this arrangement, when either one of the memory cell arrays is selected according to the address signal, the voltage at the input terminal connected to the data line corresponding to the bit line of the unselected memory cell array is kept at the pre-charge voltage.

Therefore, with the input terminal kept at the pre-charge voltage regarded as the first input terminal at the time point and with the input terminal connected to the data line corresponding to the bit line of the selected memory cell array regarded as the second input terminal, the sensing time in the case where the information of the selected nonvolatile memory cell in the two memory cell arrays is decided can be reduced similarly to the above.

According to the semiconductor storage device of one embodiment, the bit line of the unselected memory cell array out of the two memory cell arrays is disconnected from the data line by the switching circuit in the reading stage. With this arrangement, any external disturbance and interference from the unselected memory cell array to the data line side can be completely prevented.

The selecting circuit of the semiconductor storage device of one embodiment selects the voltage setting circuit boosting (or deboosting) the input terminal on the data line side connected to the bit line of the selected memory cell array based on the inputted address signal. With this arrangement, the voltage setting circuit to be operated can be appropriately selected according to the selection information of the memory cell array.

A further semiconductor storage device of the present invention operates to pre-charge the first and second input terminals of the first and second sense amplifiers, boost (or deboost) the voltage at the second input terminals of the first and second sense amplifiers by ea specified voltage by the first voltage setting circuit after a lapse of a sufficient time necessary for the voltages at the second input terminals of the first and second sense amplifiers to reduce (or increase) by two times the boosted voltage (or deboosted voltage) of the first voltage setting circuit from the selection of one nonvolatile memory cell, and operate the second voltage setting circuit or the third voltage setting circuit based on the voltages at the first and second input terminals of the first sense amplifier by the selecting circuit, thereby setting the voltages at the first and second input terminals of the second sense amplifier. With this arrangement, the relation in magnitude between the voltages at the first and second input terminals of the first sense amplifier is set according to the value of the high-order bit of the multi-valued information having at least two bits and retained in the selected nonvolatile memory cell, and the relation in magnitude between the voltages at the first and second input terminals of the second sense amplifier is set according to the value of the bit next to the high-order bit of the multi-valued information.

Therefore, the value of the high-order bit of the multi-valued information of the selected nonvolatile memory cell is discriminated based on the voltages at the first and second input terminals of the first sense amplifier, and the value of the bit next to the high-order bit can be discriminated based on the voltages at the first and second input terminals of the second sense amplifier.

In the above case, the first and second sense amplifiers use the pre-charge voltage at the first and second input terminals or its boosted (or deboosted) voltage as the reference voltage. Therefore, the reference voltage generating circuit for generating a plurality of reference voltages is not necessary, so that the increase in number of circuits due to the multi-valued construction can be suppressed.

The selecting circuit of the semiconductor storage device of one embodiment operates the third voltage setting circuit when the voltage at the first input terminal of the first sense amplifier is higher than the voltage at the second input terminal and operates the second voltage setting circuit when the voltage at the second input terminal is higher than the voltage at the first input terminal. With this arrangement, the relation in magnitude between the first and second input terminals of the second sense amplifier can be optimally set based on the relation in magnitude between the voltages at the first and second input terminals of the first sense amplifier.

A further semiconductor storage device of the present invention operates to pre-charge the first and second input terminals of the first and second sense amplifiers, boost (or deboost) the voltage at the second input terminals of the first and second sense amplifiers by a specified voltage by the voltage setting circuit after a lapse of a sufficient time necessary for the voltages at the second input terminals of the first and second sense amplifiers to reduce (or increase) by two times the boosted voltage (or deboosted voltage) of the voltage setting circuit from the selection of one nonvolatile memory cell, boost (or deboost) the second input terminal of the second sense amplifier by the specified voltage by the first capacitive element when the voltage at the first input terminal of the first sense amplifier is higher than the voltage at the second input terminal, and boost (or deboost) the first input terminal of the second sense amplifier by the specified voltage by the second capacitive element when the voltage at the second input terminal of the first sense amplifier is higher than the voltage at the first input terminal. With this arrangement, the relation in magnitude between the voltages at the first and second input terminals of the first sense amplifier is set according to the value of the high-order bit of the multi-valued information having at least two bits retained in the selected nonvolatile memory cell. On the other hand, the relation in magnitude between the voltages at the first and second input terminals of the second sense amplifier is set according to the value of the bit next to the high-order bit of the multi-valued information.

Therefore, the value of the high-order bit of the multi-valued information of the selected nonvolatile memory cell is discriminated based on the voltages at the first and second input terminals of the first sense amplifier, and the value of the bit next to the high-order bit can be discriminated based on the voltages at the first and second input terminals of the second sense amplifier.

In the above case, the first and second sense amplifiers use the pre-charge voltage at the first and second input terminals or its boosted (or deboosted) voltage as the reference voltage. Therefore, the reference voltage generating circuit for generating a plurality of reference voltages is not necessary, so that the increase in number of circuits due to the multi-valued construction can be suppressed.

Furthermore, the relation in magnitude between the voltages at the first and second input terminals of the second sense amplifier is set in a short time by the first and second capacitive elements based on the relation in magnitude between the voltages at the first and second input terminals of the first sense amplifier. Therefore, by executing one time the sensing operation by the first and second sense amplifiers, the multi-valued information retained in the selected nonvolatile memory cell can be decided in a short access time.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor storage device comprising:
   a memory cell array having a plurality of nonvolatile memory cells, bit lines and word lines;
   a row decoding circuit which selects the word line of the memory cell array;
   a column decoding circuit which selects the bit line of the memory cell array;
   a data line connected to the bit line selected by the column decoding circuit;
   a sense amplifier which has a first input terminal and a second input terminal connected to the data line and amplifies a voltage difference between the first input terminal and the second input terminal;
   a pre-charging circuit which pre-charges the first and second input terminals with a specified voltage;
   a switching circuit which effects connection and disconnection between the data line and the second input terminal; and
   a voltage setting circuit which boosts or deboosts the voltage at the second input terminal by a specified voltage, thereby setting a sensing level of the sense amplifier.

2. A semiconductor storage device as claimed in claim 1, wherein
   the pre-charging circuit pre-charges the first and second input terminals with an equal voltage.

3. A semiconductor storage device as claimed in claim 1, further comprising:
   a memory cell array having a plurality of nonvolatile memory cells, bit lines and word lines;
   a row decoding circuit which selects the word line of the memory cell array;
   a column decoding circuit which selects the bit line of the memory cell array;
   a data line connected to the first input terminal of the sense amplifier and the bit line selected by the column decoding circuit;
   a switching circuit which effects connection and disconnection between the first input terminal of the sense amplifier and the data line of the first input terminal side;
   a voltage setting circuit which boosts or deboosts the voltage at the first input terminal by the specified voltage, thereby setting the sensing level of the sense amplifier; and
   a selecting circuit which selectively operates either one of the voltage setting circuit for boosting or deboosting the voltage at the first input terminal and the voltage setting circuit for boosting or deboosting the voltage at the second input terminal.

4. A semiconductor storage device as claimed in claim 3, further comprising:
   a switching circuit which disconnects the bit line of an unselected memory cell array from the data line in the reading stage.

5. A semiconductor storage device as claimed in claim 3, wherein
   the selecting circuit selectively operates the voltage setting circuit for boosting or deboosting the input terminal connected to the data line connected to the bit line of the selected memory cell array based on an inputted address signal.

6. A semiconductor storage device comprising:
   a memory cell array having a plurality of nonvolatile memory cells, bit lines and word lines;
   a row decoding circuit which selects the word line of the memory cell array;
   a column decoding circuit which selects the bit line of the memory cell array;
   at least two first and second sense amplifiers which have a first input terminal and a second input terminal connected to the bit line and amplify a voltage difference between the first input terminal and the second input terminal;
   a switching circuit which effects connection and disconnection between the bit line selected by the column decoding circuit and the second input terminals of the first and second sense amplifiers;
   a pre-charging circuit which pre-charges the first and second input terminals of the first and second sense amplifiers with a specified voltage;
   a first voltage setting circuit which boosts or deboosts the voltages at the second input terminals of the first and second sense amplifiers by a specified voltage, thereby setting the voltage at the second input terminals;
   a second voltage setting circuit which boosts or deboosts the voltage at the first input terminal of the second sense amplifier by a specified voltage, thereby setting a sensing level of the second sense amplifier;
   a third voltage setting circuit which boosts or deboosts the voltage at the second input terminal of the second sense amplifier by a specified voltage, thereby setting the sensing level of the second sense amplifier; and
   a selecting circuit which selectively operates either one of the second voltage setting circuit and the third voltage setting circuit based on the voltages at the first input terminal and the second input terminal of the first sense amplifier.

7. A semiconductor storage device as claimed in claim 6, wherein
   the selecting circuit operates the third voltage setting circuit when the voltage at the first input terminal of the first sense amplifier is higher than the voltage at the second input terminal and operates the second voltage setting circuit when the voltage at the second input terminal is higher than the voltage at the first input terminal.

8. A semiconductor storage device comprising:

a memory cell array having a plurality of nonvolatile memory cells, bit lines and word lines;

a row decoding circuit which selects the word line of the memory cell array;

a column decoding circuit which selects the bit line of the memory cell array;

at least two first and second sense amplifiers which have a first input terminal and a second input terminal connected to the bit line and amplify a voltage difference between the first input terminal and the second input terminal;

a switching circuit which effects connection and disconnection between the bit line selected by the column decoding circuit and the second input terminals of the first and second sense amplifiers;

a pre-charging circuit which pre-charges the first and second input terminals of the first and second sense amplifiers with a specified voltage;

a voltage setting circuit which boosts or deboosts the voltages at the second input terminals of the first and second sense amplifiers by a specified voltage, thereby setting the voltage at the second input terminal;

a first capacitive element provided across the first input terminal of the first sense amplifier and the second input terminal of the second sense amplifier; and a second capacitive element provided across the second input terminal of the first sense amplifier and the first input terminal of the second sense amplifier.

* * * * *

UNITED STATES PATENT AND TRADEMARK OFFICE

CERTIFICATE OF CORRECTION

PATENT NO. : 5,917,767

DATED : June 29, 1999

INVENTOR: Yoshiji Ohta

It is certified that error appears in the above-identified patent and that said Letters Patent is hereby corrected as shown below:

On the title page, item [54] and column 1:

-- SEMICONDUCTOR STORAGE DEVICE WHICH INHIBITS THE IMPAIRMENT OF SENSING SENSITIVITY AND SPEED EVEN WHEN A NUMBER OF MEMORY CELLS ARE CONNECTED TO AN EXTENSION BITLINE--

Signed and Sealed this

Twenty-fifth Day of January, 2000

Attest:

Attesting Officer

*Acting Commissioner of Patents and Trademarks*